(12) United States Patent
Matsuoka

(10) Patent No.: US 9,401,602 B2
(45) Date of Patent: Jul. 26, 2016

(54) SEMICONDUCTOR INTEGRATED CIRCUIT DEVICE

(71) Applicant: PANASONIC CORPORATION, Osaka (JP)

(72) Inventor: Daisuke Matsuoka, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 295 days.

(21) Appl. No.: 14/243,523

(22) Filed: Apr. 2, 2014

(65) Prior Publication Data

US 2014/0211357 A1   Jul. 31, 2014

Related U.S. Application Data

(63) Continuation of application No. PCT/JP2012/004334, filed on Jul. 4, 2012.

(30) Foreign Application Priority Data

Oct. 6, 2011   (JP) .................. 2011-222253

(51) Int. Cl.

| H02H 3/22 | (2006.01) |
|---|---|
| H02H 9/04 | (2006.01) |
| H01L 23/522 | (2006.01) |
| H01L 27/06 | (2006.01) |
| H01L 27/02 | (2006.01) |

(Continued)

(52) U.S. Cl.
CPC ............ *H02H 9/041* (2013.01); *H01L 23/5223* (2013.01); *H01L 27/0285* (2013.01); *H01L 27/0629* (2013.01); *H01L 27/0676* (2013.01); *H01L 2924/0002* (2013.01); *H02H 3/20* (2013.01); *H02H 9/046* (2013.01); *H03K 19/0013* (2013.01)

(58) Field of Classification Search
USPC .................................... 361/56, 111
See application file for complete search history.

(56) References Cited

U.S. PATENT DOCUMENTS

| 2003/0102813 A1* | 6/2003 | Humphrey .......... H01L 27/0285 315/169.3 |
|---|---|---|
| 2005/0057873 A1 | 3/2005 | Kitagawa |
| 2005/0073009 A1 | 4/2005 | Kojima et al. |

(Continued)

FOREIGN PATENT DOCUMENTS

| JP | 04-257256 A | 9/1992 |
|---|---|---|
| JP | 2005-093497 A | 4/2005 |

(Continued)

OTHER PUBLICATIONS

International Search Report Issued in PCT/JP2012/004334. dated Sep. 4, 2012, with English translation.

*Primary Examiner* — Danny Nguyen
(74) *Attorney, Agent, or Firm* — McDermott Will & Emery LLP

(57) ABSTRACT

An ESD protection circuit includes a resistive element, a capacitive element, a protecting element, and a controller. The resistive element, the protecting element, and the controller are provided in an element formation layer. At least part of the capacitive element includes an interconnect capacitor provided in a plurality of interconnect layers. When viewed in plan, at least part of a capacitance formation region in which the interconnect capacitor is provided overlaps at least part of an element formation region in which the resistive element, the protecting element, and the controller are provided.

12 Claims, 30 Drawing Sheets

(51) Int. Cl.
*H02H 3/20* (2006.01)
*H03K 19/00* (2006.01)

(56) References Cited

U.S. PATENT DOCUMENTS

| | | |
|---|---|---|
| 2006/0081892 A1 | 4/2006 | Tateyama |
| 2008/0173899 A1 | 7/2008 | Takakuwa et al. |
| 2008/0265339 A1 | 10/2008 | Komatsu |
| 2010/0302694 A1 | 12/2010 | Morishita |
| 2013/0063843 A1* | 3/2013 | Chen ............... H01L 23/552 361/56 |

FOREIGN PATENT DOCUMENTS

| | | |
|---|---|---|
| JP | 2009-147040 A | 7/2009 |
| JP | 2010-278109 A | 12/2010 |
| WO | 2007-145307 A1 | 12/2007 |

* cited by examiner

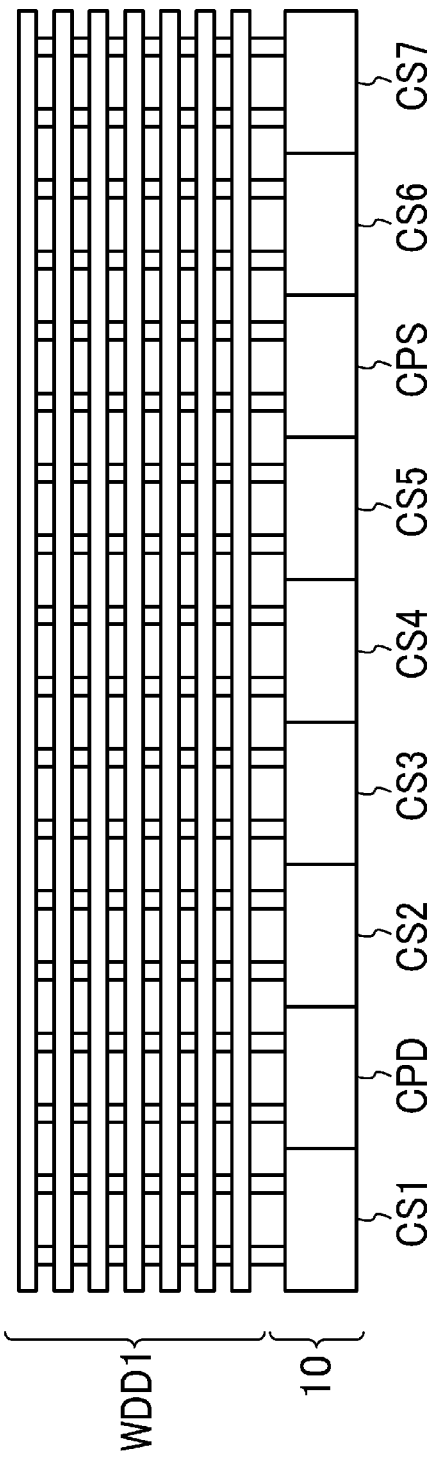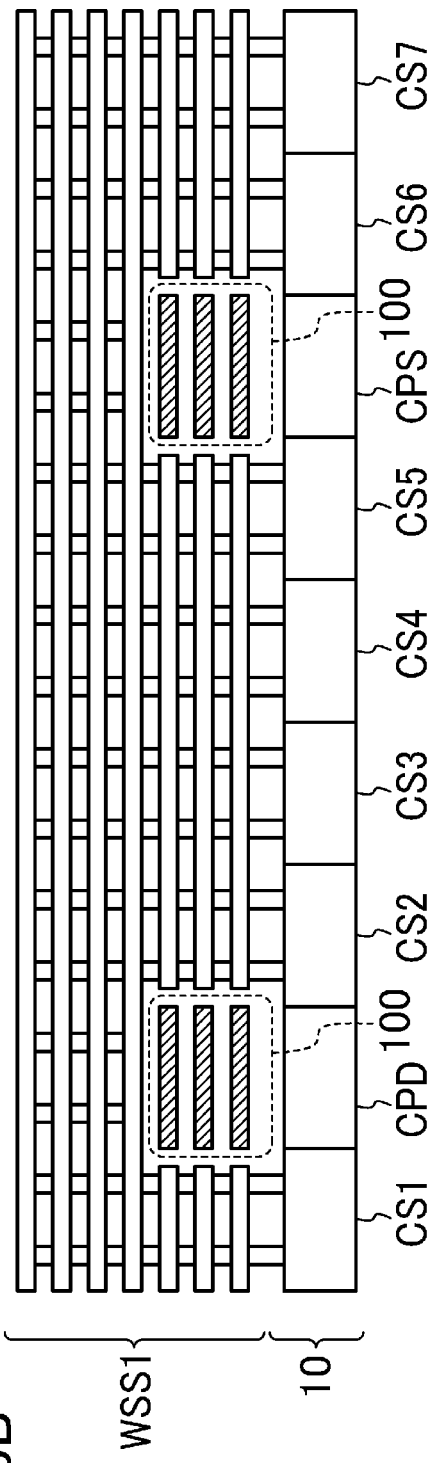

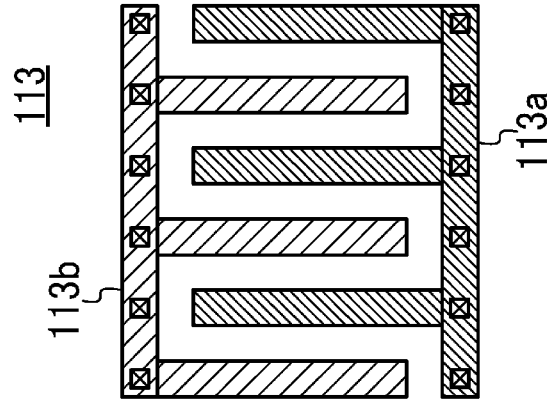
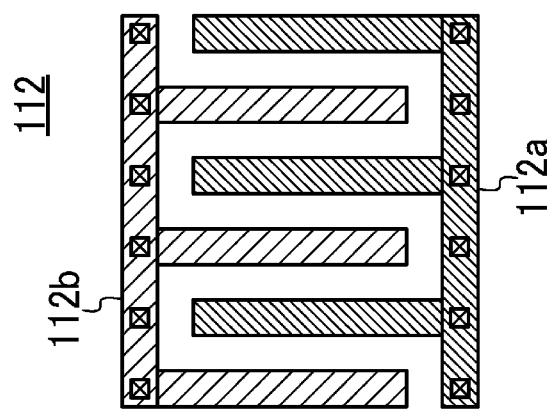
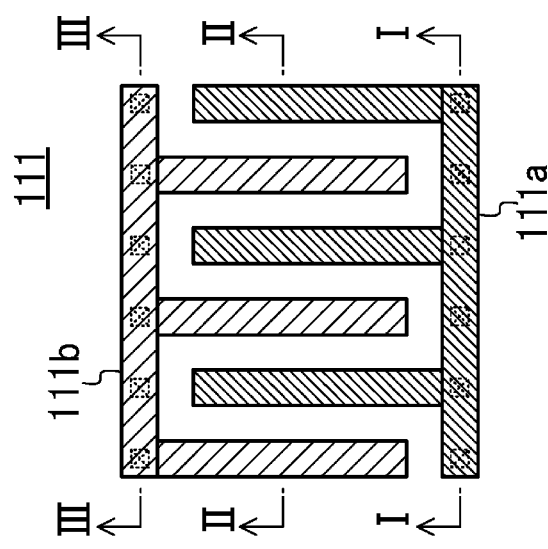

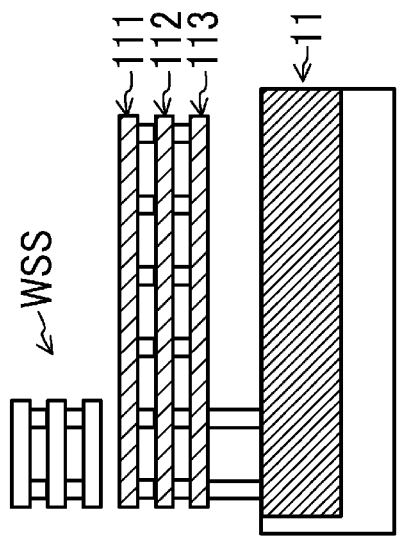
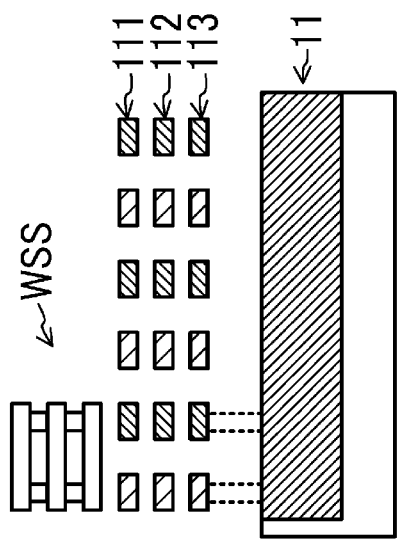
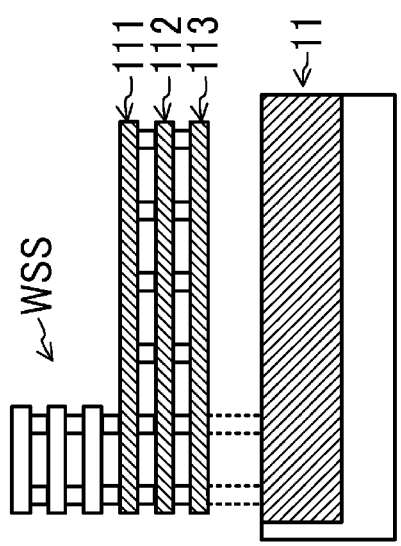

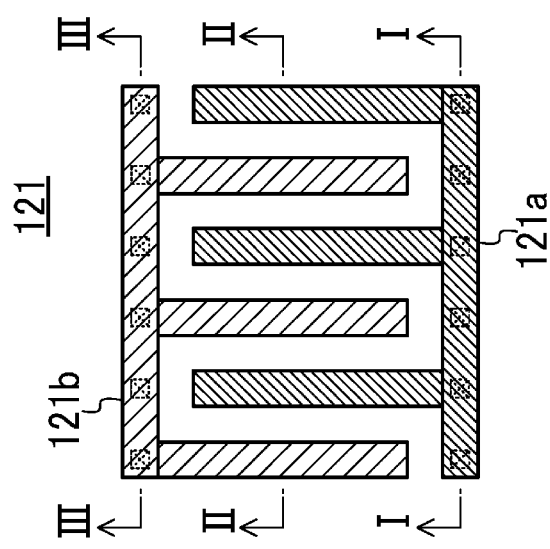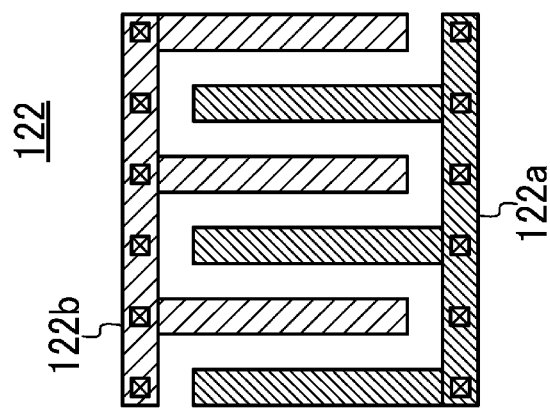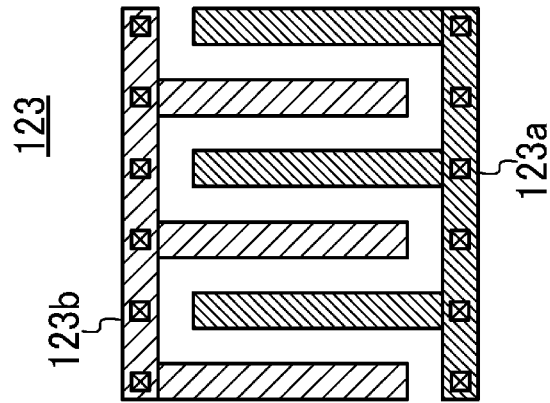

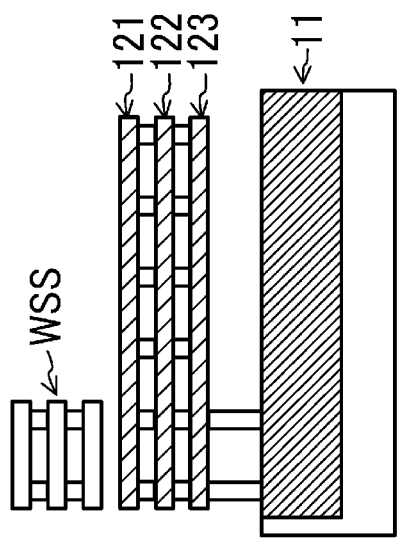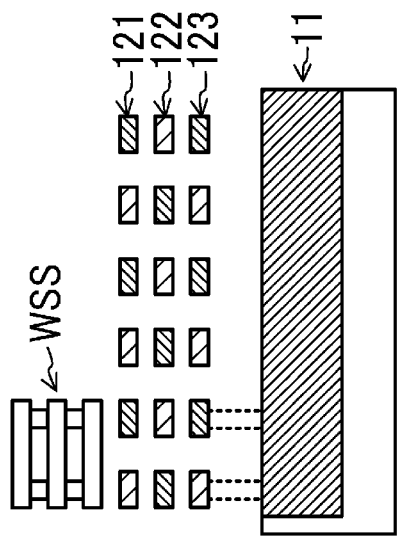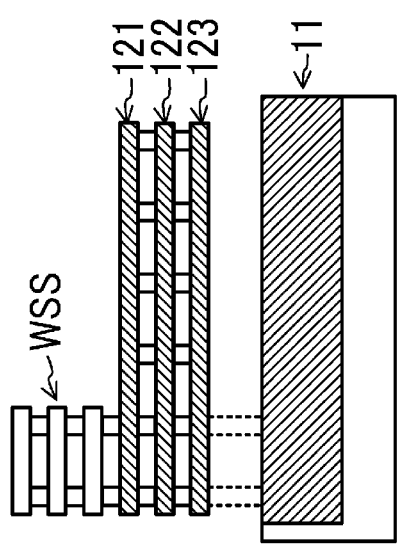

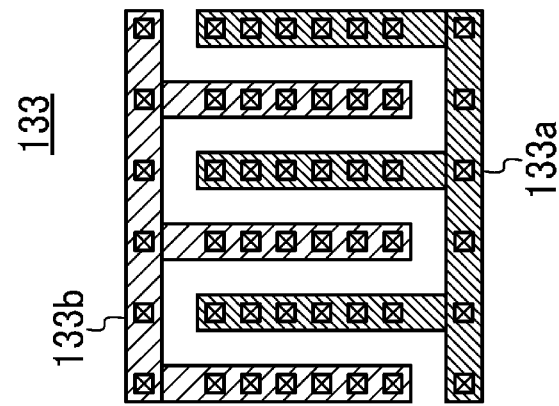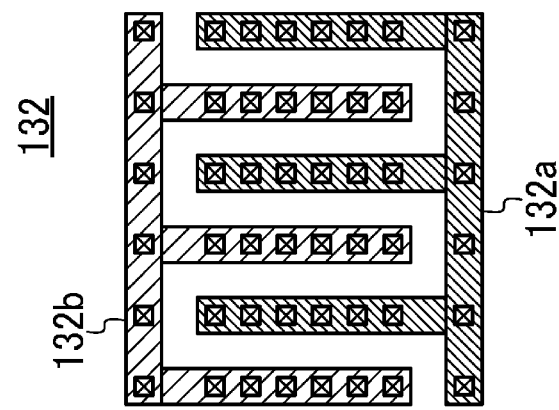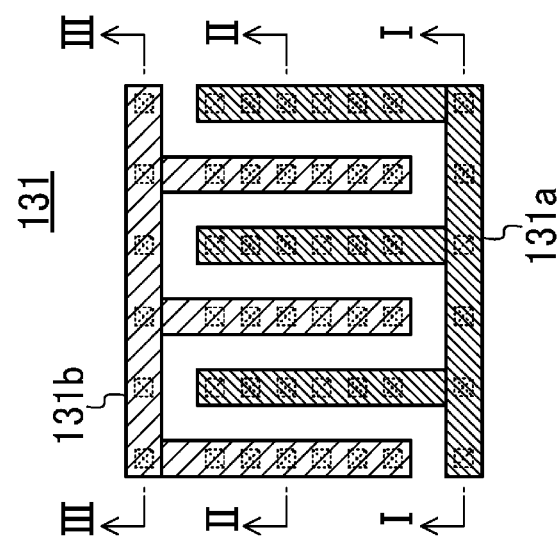

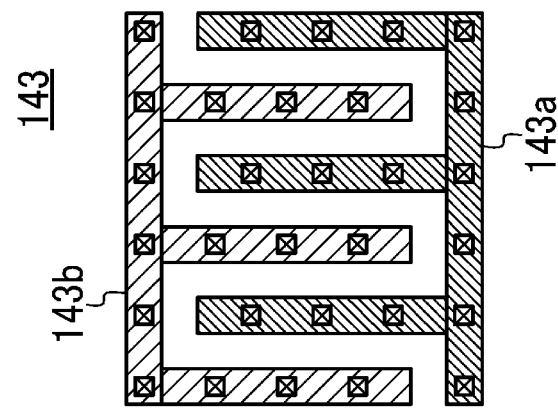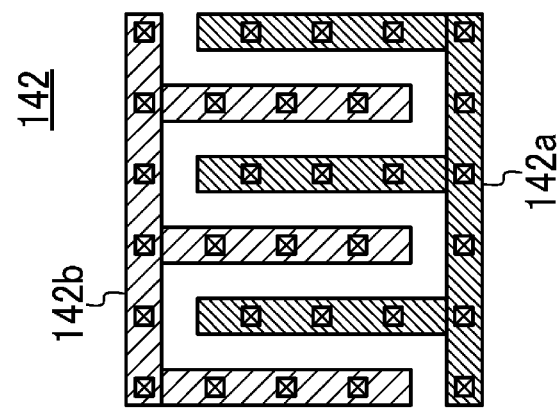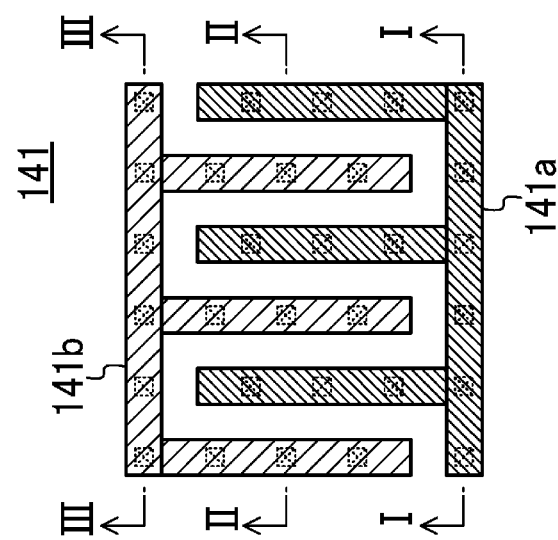

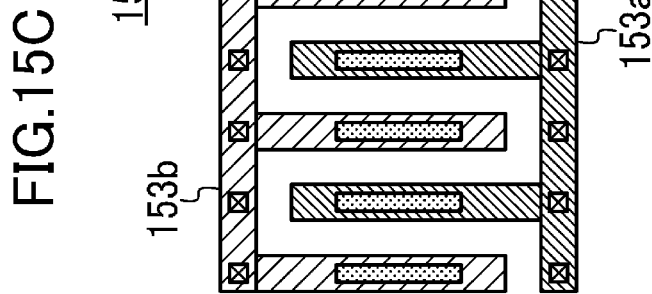
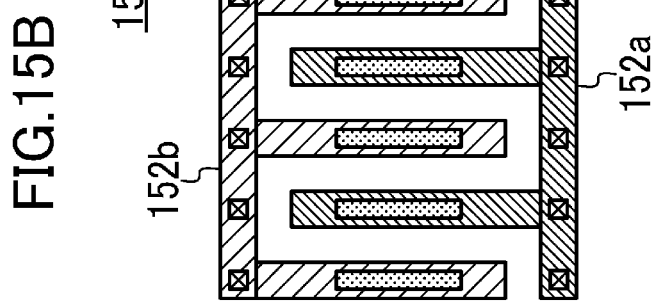
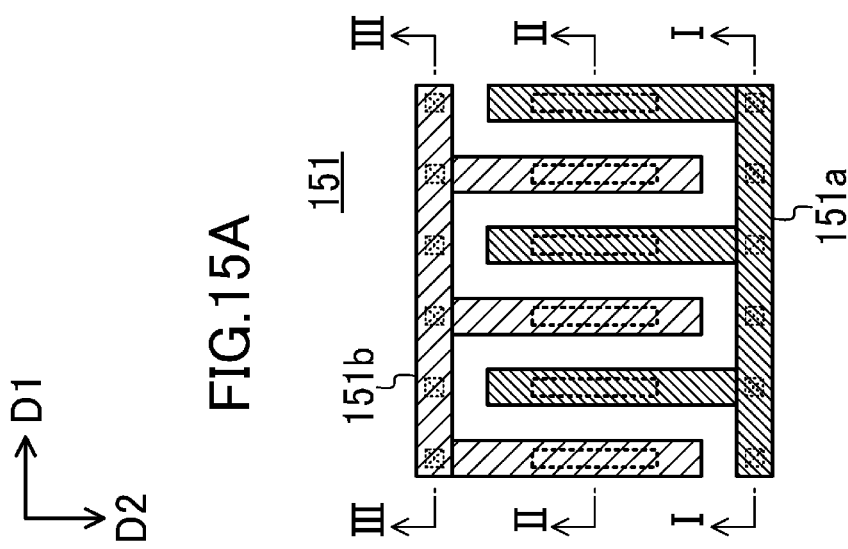

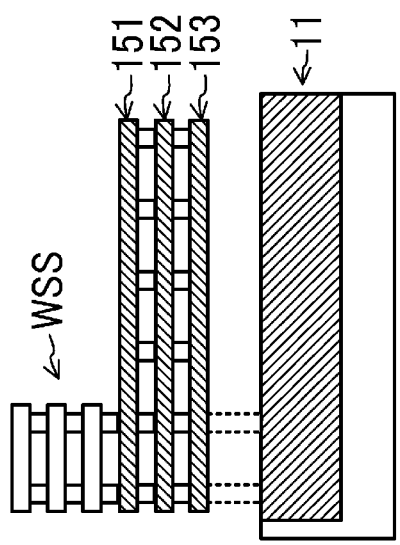
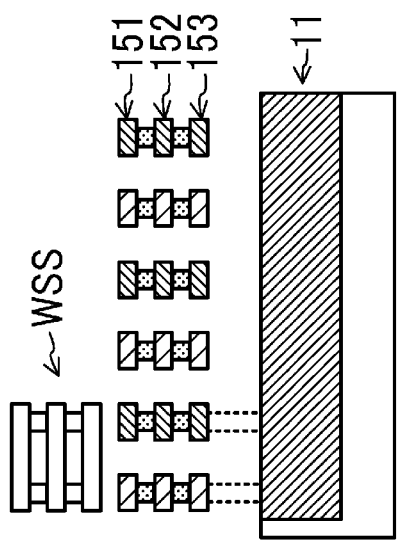
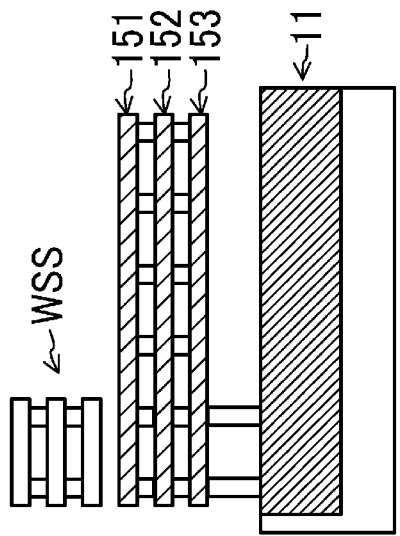

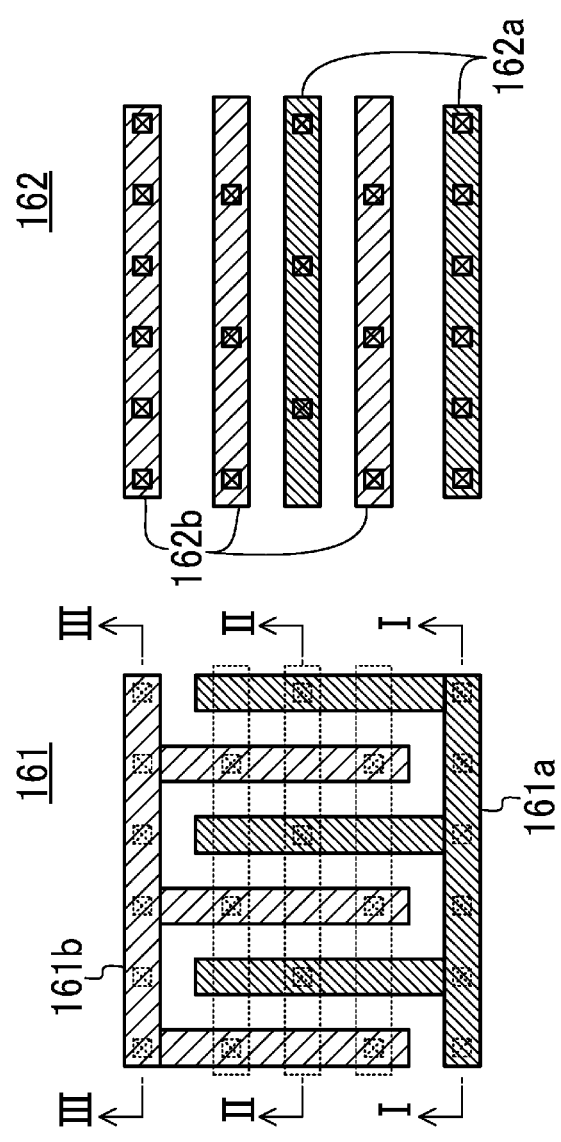

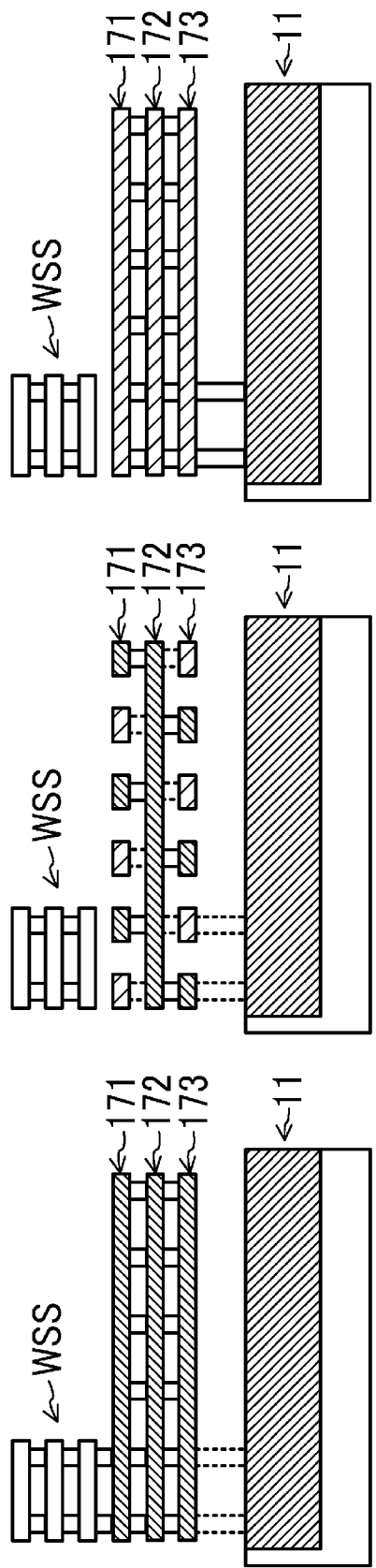

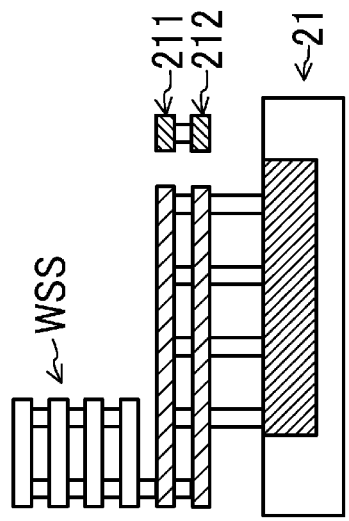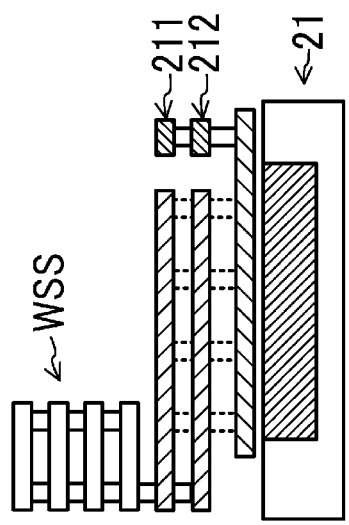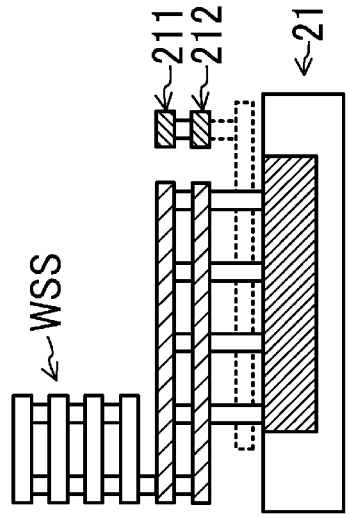

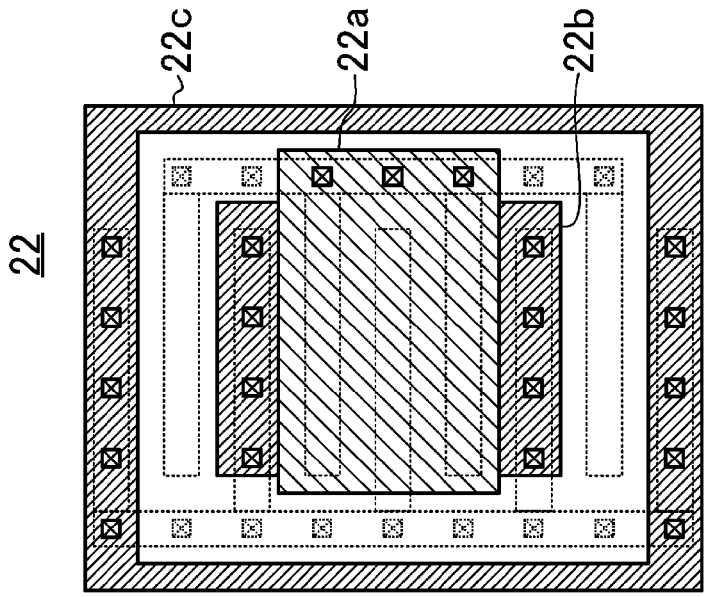
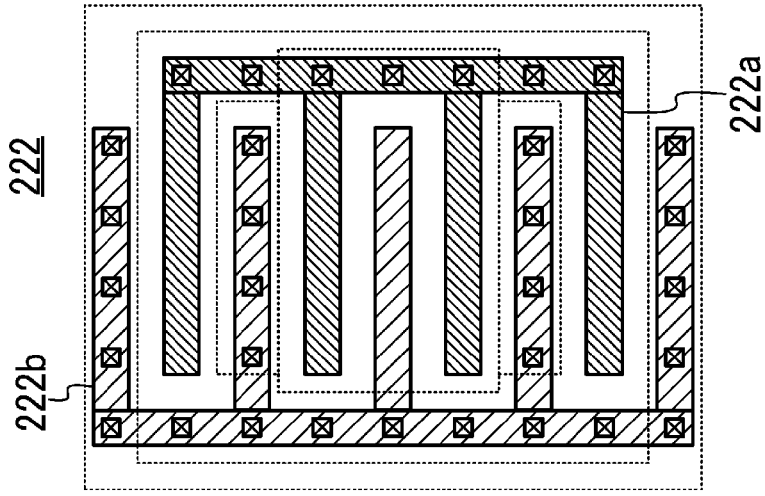
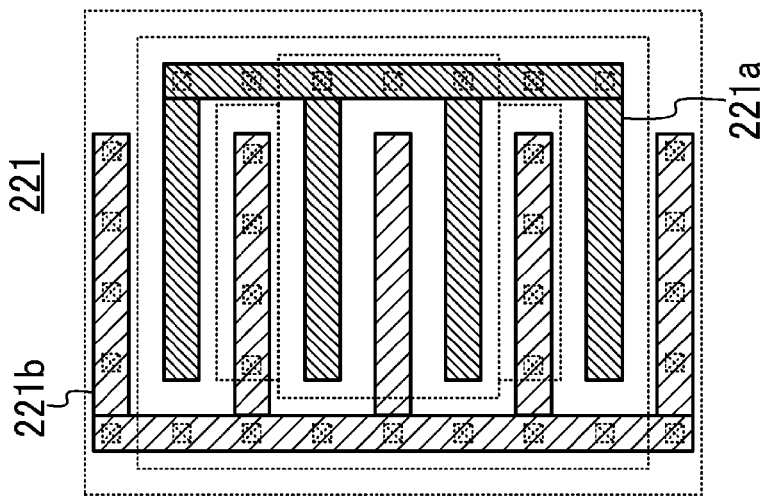

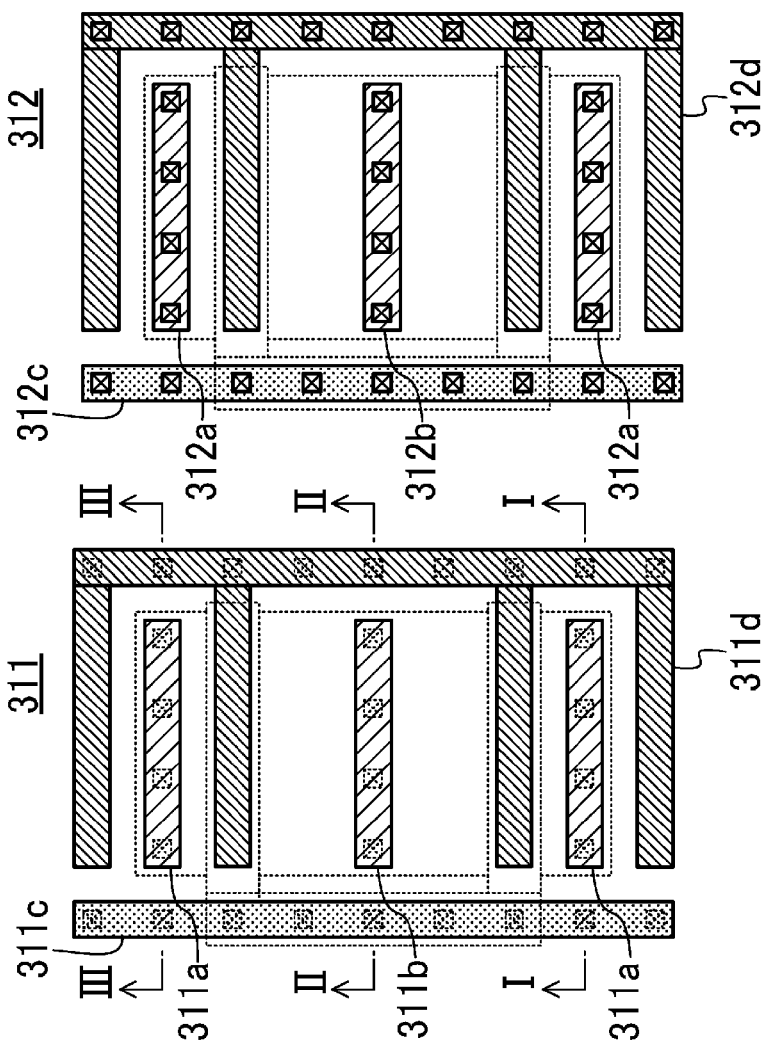

SEMICONDUCTOR INTEGRATED CIRCUIT DEVICE

CROSS-REFERENCE TO RELATED APPLICATIONS

This is a continuation of International Application No. PCT/JP2012/004334 filed on Jul. 4, 2012, which claims priority to Japanese Patent Application No. 2011-222253 filed on Oct. 6, 2011. The entire disclosures of these applications are incorporated by reference herein.

BACKGROUND

The technique disclosed herein relates to semiconductor integrated circuit devices, and more specifically, to a semiconductor integrated circuit device including an ESD protection circuit.

In recent years, with an improvement in the performance of semiconductor integrated circuits, the thickness of gate oxide films of transistors tends to be reduced in order to enhance the drivability of the transistors. The reduction in the thickness of the gate electrode films has reduced resistance to a breakdown caused by electrostatic discharge (ESD). In order to protect the semiconductor integrated circuits from the breakdown caused by the ESD, it has become important to provide ESD protection circuits. For example, when a semiconductor integrated circuit includes a plurality of power supply systems, such as the case where power supplies are separated between a digital circuit and an analog circuit in order to reduce noise propagation, and the case where power supplies are separated between a plurality of circuits in order to allow a stand-by state of some of the plurality of circuits, an ESD protection circuit is provided in each of the power supply systems.

In general, since the area of the ESD protection circuit is larger than that of a logic circuit, it becomes important to reduce an increase in the area of the ESD protection circuit. Therefore, Japanese Unexamined Patent Publication No. 2005-093497 describes an ESD protection circuit in which an abnormal current caused by a high voltage such as ESD can be quickly discharged, and the size of constituent elements is small. The ESD protection circuit uses an RC delay caused by a resistive element and a capacitive element.

SUMMARY

However, in the ESD protection circuit using the RC delay, when delay time by the RC delay increases, the resistance value of a resistive element and the capacitance value of a capacitive element increase. In this case, the area of the resistive element and the capacitive element increases, so that the area of the semiconductor integrated circuit device including the ESD protection circuit also increases. For example, when an ESD protection circuit is adapted to an ESD waveform whose apply period is relatively long similar to a human body model (HBM), the resistance value of a resistive element is set to about several hundreds of kΩ, and the capacitance value of a capacitive element is set to about several picofarads (pF). For this reason, it has been difficult to reduce an increase in the area of semiconductor integrated circuit devices.

Therefore, it is an objective of the technique disclosed herein to provide a semiconductor integrated circuit device including an ESD protection circuit, wherein an increase in the area of the semiconductor integrated circuit device along with an increase in the capacitance value of capacitive elements included in the ESD protection circuit is reduced.

According to an aspect of the present disclosure, a semiconductor integrated circuit device includes: an ESD protection circuit; an element formation layer; and a plurality of interconnect layers above the element formation layer, wherein the ESD protection circuit includes a resistive element and a capacitive element connected in series between a first terminal and a second terminal of the ESD protection circuit, a protecting element connected between the first terminal and the second terminal, and a controller configured to control a conductive state of the protecting element in accordance with a potential at a connect node between the resistive element and the capacitive element, the resistive element, the protecting element, and the controller are provided in the element formation layer, at least part of the capacitive element includes an interconnect capacitor provided in the interconnect layers, and when viewed in plan, at least part of a capacitance formation region in which the interconnect capacitor is provided overlaps at least part of an element formation region in which the resistive element, the protecting element, and the controller are provided.

In the semiconductor integrated circuit device described above, since one or more interconnect layers above the element formation region in the stacking direction of the element formation layer and the interconnect layers can be effectively used as an interconnect capacitor, it is possible to reduce an increase in area caused by an increase in the capacitance value of a capacitive element included in the ESD protection circuit.

The interconnect layers may include a plurality of interconnects separated from each other to form the interconnect capacitor.

The interconnect layers may include a first interconnect layer, the first interconnect layer may include a first capacitance interconnect and a second capacitance interconnect which are separated from each other and extend in a first direction when viewed in plan, the first capacitance interconnect may include a plurality of first interconnect portions extending in a second direction orthogonal to the first direction, the second capacitance interconnect may include a plurality of second interconnect portions extending in the second direction, and each of the second interconnect portions of the second capacitance interconnect may be arranged between adjacent ones of the first interconnect portions of the first capacitance interconnect when viewed in plan. With this configuration, it is possible to reduce the area of the capacitance interconnect compared to the case where a parallel flat plate capacitor is formed by flat plate capacitance interconnects each arranged in a corresponding one of interconnect layers adjacent to each other.

The interconnect layers may include a second interconnect layer adjacent to the first interconnect layer in a stacking direction of the interconnect layers, the second interconnect layer may include a third capacitance interconnect and a fourth capacitance interconnect which are separated from each other and extend in the first direction when viewed in plan, the third capacitance interconnect may include a plurality of third interconnect portions extending in the second direction, the fourth capacitance interconnect may include a plurality of fourth interconnect portions extending in the second direction, each of the fourth interconnect portions of the fourth capacitance interconnect may be arranged between adjacent ones of the third interconnect portions of the third capacitance interconnect when viewed in plan, the third capacitance interconnect and the first capacitance interconnect may overlap each other when viewed in plan, and the fourth capacitance interconnect and the second capacitance interconnect may overlap each other when viewed in plan.

With this configuration, it is possible to increase the capacitance value of the interconnect capacitor per unit area.

The element formation layer may include a plurality of I/O cells arranged in a cell arrangement direction, the ESD protection circuit may be arranged in a power supply cell of the I/O cells, a power supply voltage or a ground voltage being applied to the power supply cell, at least one of the interconnect layers may include a supplying interconnect extending in the cell arrangement direction above the I/O cells to supply the I/O cells with the power supply voltage or the ground voltage applied to the power supply cell, interconnect layers included in an overlapping interconnect portion may be fewer than interconnect layers included in an non-overlapping interconnect portion, the overlapping interconnect portion being a portion of the supplying interconnect which overlaps part of the power supply cell when viewed in plan, the non-overlapping interconnect portion being a portion of the supplying interconnect except the overlapping interconnect portion, and the interconnect capacitor may be provided in a region of the interconnect layers which overlaps part of the power supply cell when viewed in plan. With this configuration, it is possible to increase the number of interconnect layers which can be effectively used as the interconnect capacitor.

The interconnect capacitor may be provided in one or more of the interconnect layers which are adjacent to the element formation layer in a stacking direction of the interconnect layers. With this configuration, the interconnect layers can be efficiently used.

The resistive element may include at least one of a polysilicon resistor, a diffusion resistor, or a well resistor.

The protecting element may include at least one of a MOS transistor or a bipolar transistor.

The controller may include an inverter circuit connected between a connect node between the resistive element and the capacitive element and the protecting element.

A resistance value of a current path between one of the first terminal or the second terminal and the protecting element may be larger than a resistance value of a current path between the other of the first terminal or the second terminal and the protecting element.

According to another aspect of the present disclosure, a semiconductor integrated circuit device includes: an ESD protection circuit; an element formation layer; and a plurality of interconnect layers above the element formation layer, wherein the ESD protection circuit includes a resistive element and a capacitive element connected in series between a first terminal and a second terminal of the ESD protection circuit, a protecting element connected between the first terminal and the second terminal, and a controller configured to control a conductive state of the protecting element in accordance with a potential at a connect node between the resistive element and the capacitive element, the resistive element, the protecting element, and the controller are provided in the element formation layer, the capacitive element includes an interconnect capacitor provided in the interconnect layers and a MOS capacitor provided in the element formation layer, and when viewed in plan, at least part of a capacitance formation region in which the interconnect capacitor is provided overlaps at least part of an element formation region in which the resistive element, the protecting element, the controller, and the MOS capacitor are provided.

In the semiconductor integrated circuit device described above, since one or more interconnect layers above the element formation region in the stacking direction can be effectively used as an interconnect capacitor, it is possible to reduce an increase in area caused by an increase in the capacitance value of a capacitive element included in the ESD protection circuit.

The MOS capacitor may have a gate electrode which is in a cross shape when viewed in plan. With this configuration, it is possible to increase the capacitance value of the MOS capacitor per unit area.

BRIEF DESCRIPTION OF THE DRAWINGS

FIG. 6A is cross-sectional view illustrating an example cross-sectional configuration along the line A-A of the I/O cell row of FIG. 4.

FIG. 6B is a cross-sectional view illustrating an example cross-sectional configuration along the line B-B of the I/O cell row of FIG. 4.

FIGS. 7A-7C are plan views illustrating a first example configuration of interconnect capacitor.

FIGS. 8A-8C are cross-sectional views illustrating the first example configuration of the interconnect capacitor.

FIGS. 9A-9C are plan views illustrating a second example configuration of the interconnect capacitor.

FIGS. 10A-10C are cross-sectional views illustrating the second example configuration of the interconnect capacitor.

FIGS. 11A-11C are plan views illustrating a third example configuration of the interconnect capacitor.

FIGS. 13A-13C are plan views illustrating a fourth example configuration of the interconnect capacitor.

FIGS. 15A-15C are plan views illustrating a fifth example configuration of the interconnect capacitor.

FIGS. 16A-16C are cross-sectional views illustrating the fifth example configuration of the interconnect capacitor.

FIGS. 17A-17C are plan views illustrating a sixth example configuration of the interconnect capacitor.

FIGS. 20A-20C are cross-sectional views illustrating the seventh example configuration of the interconnect capacitor.

FIGS. 23A-23C are cross-sectional views illustrating the first example configuration of the interconnect capacitor and the MOS capacitor.

FIGS. 24A-24C are plan views illustrating a second example configuration of the interconnect capacitor and the MOS capacitor.

FIGS. 27A-27C are plan views illustrating interconnect capacitor and an example configuration of a protecting element.

DETAILED DESCRIPTION

Figure 1:
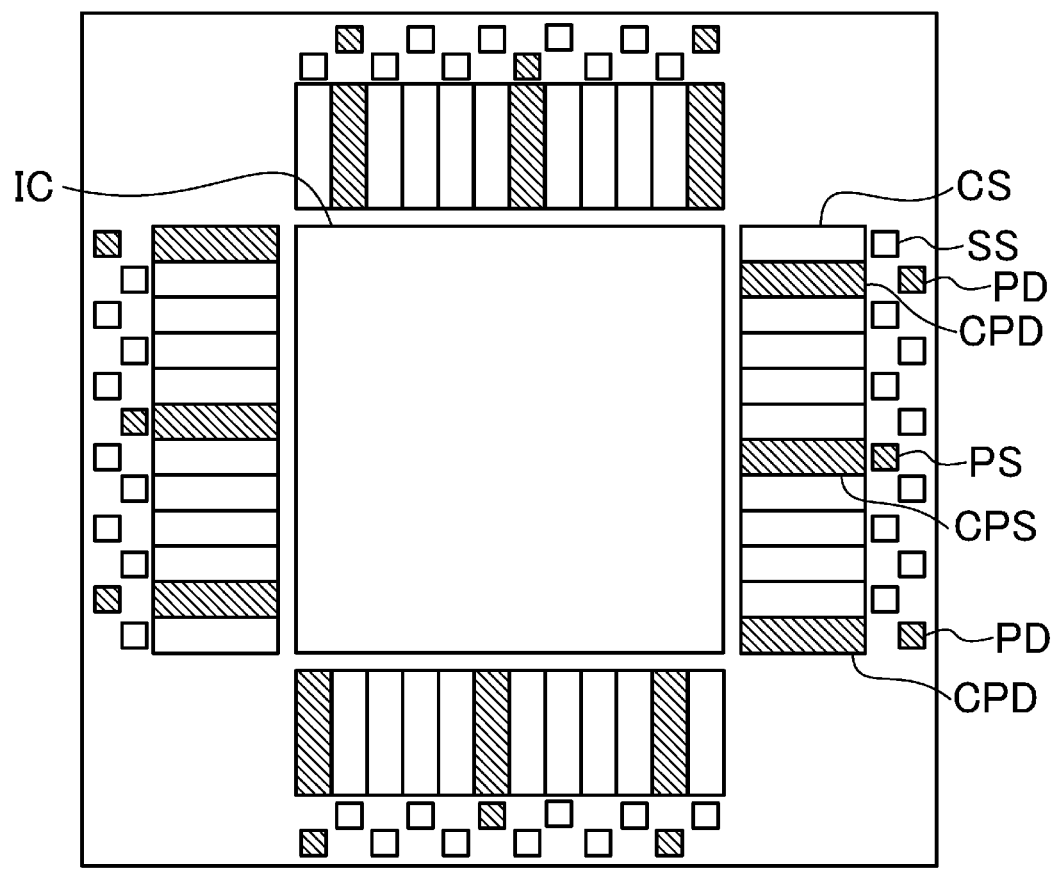
FIG. 1 is a plan view illustrating an example plan configuration of a semiconductor integrated circuit device according to a first embodiment.

Embodiments will be described in detail hereinafter with reference to the drawings. In the drawings, like reference characters have been used to designate identical or equivalent elements, and explanation thereof is not repeated.

First Embodiment

FIG. 1 illustrates an example plan configuration of a semiconductor integrated circuit device according to a first embodiment. The semiconductor integrated circuit device includes a rectangular internal circuit IC, a plurality of I/O cells arranged in a rectangular frame shape surrounding the internal circuit IC, and a plurality of electrode pads arranged in a rectangular frame shape surrounding the internal circuit IC and the I/O cells. The electrode pads include power supply pads PD to which a power supply voltage VDD is applied, ground pads PS to which a ground voltage VSS is applied, and signal pads SS for inputting/outputting electrical signals. The I/O cells include power supply cells CPD each electrically connected to the power supply pad PD, power supply cells CPS each electrically connected to the ground pad PS, and signal input/output pads CS each electrically connected to the signal pad SS. The power supply cells CPD and CPS respectively supply the power supply voltage VDD applied to the power supply pads PD and the ground voltage VSS applied to the ground pads PS to the other I/O cells (the signal input/output cells CS in the present embodiment) and the internal circuit IC. An electrical signal applied to the signal pad SS from the outside of the semiconductor integrated circuit device is input to the internal circuit IC via the signal pad SS and the signal input/output cell CS. An electrical signal applied from the internal circuit IC to the signal input/output cell CS is output to the outside of the semiconductor integrated circuit device via the signal input/output cell CS and signal pad SS.

The semiconductor integrated circuit device includes an element formation layer and a plurality of interconnect layers stacked above the element formation layer. Circuit components of circuits (e.g., components of the I/O cells) of the semiconductor integrated circuit device are formed in the element formation layer. Interconnects for electrically connecting the circuits of the semiconductor integrated circuit device (e.g., interconnects for electrically connecting the components of the I/O cells, the internal circuit IC, and the electrode pads to each other) are formed in the interconnect layers.

Note that the electrode pads may be arranged above the I/O cells (in an upper portion of the semiconductor integrated circuit device in the stacking direction of the interconnect layers above the element formation layer) such that each electrode pad overlaps the I/O cell when viewed in plan. For example, each power supply pad PD may be arranged above the power supply cell CPD so as to overlap the power supply cell CPD when viewed in plan. The same applies to the ground pads PS and the signal pads SS.

[ESD Protection Circuit]

Figure 2:
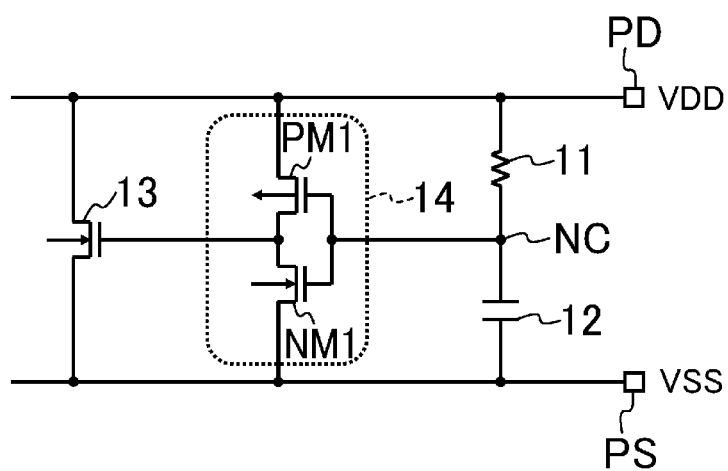
FIG. 2 is a circuit diagram illustrating an example configuration of an ESD protection circuit.

The semiconductor integrated circuit device further includes ESD protection circuits. The ESD protection circuits are circuits for protecting a semiconductor integrated circuit (e.g., the internal circuit IC) against a breakdown caused by electrostatic discharge (ESD). Here, the ESD protection circuits are each disposed in the power supply cell of the I/O cells. As illustrated in FIG. 2, each ESD protection circuit includes a resistive element 11, a capacitive element 12, a protecting element 13, and a controller 14. The resistive element 11 and the capacitive element 12 are connected in series between the power supply pad PD and the ground pad PS. The protecting element 13 is connected between the power supply pad PD and the ground pad PS. A controller 14 controls the conductive state of the protecting element 13 in accordance with the potential at the connect node NC between the resistive element 11 and the capacitive element 12. For example, the resistive element 11 may include at least one of a polysilicon resistor, a diffusion resistor, or a well resistor formed on a principal plane of a semiconductor substrate. The protecting element 13 may include at least one of an NMOS transistor, a PMOS transistor, an NPN bipolar transistor, or a PNP bipolar transistor formed on the principal plane of the semiconductor substrate. In the present embodiment, the resistive element 11 and the protecting element 13 respectively include a polysilicon resistor and an NMOS transistor. The controller 14 may include an inverter circuit including a PMOS transistor PM1 and an NMOS transistor NM1 formed on the principal plane of the semiconductor substrate.

[Arrangement of I/O Cells]

Figure 3:
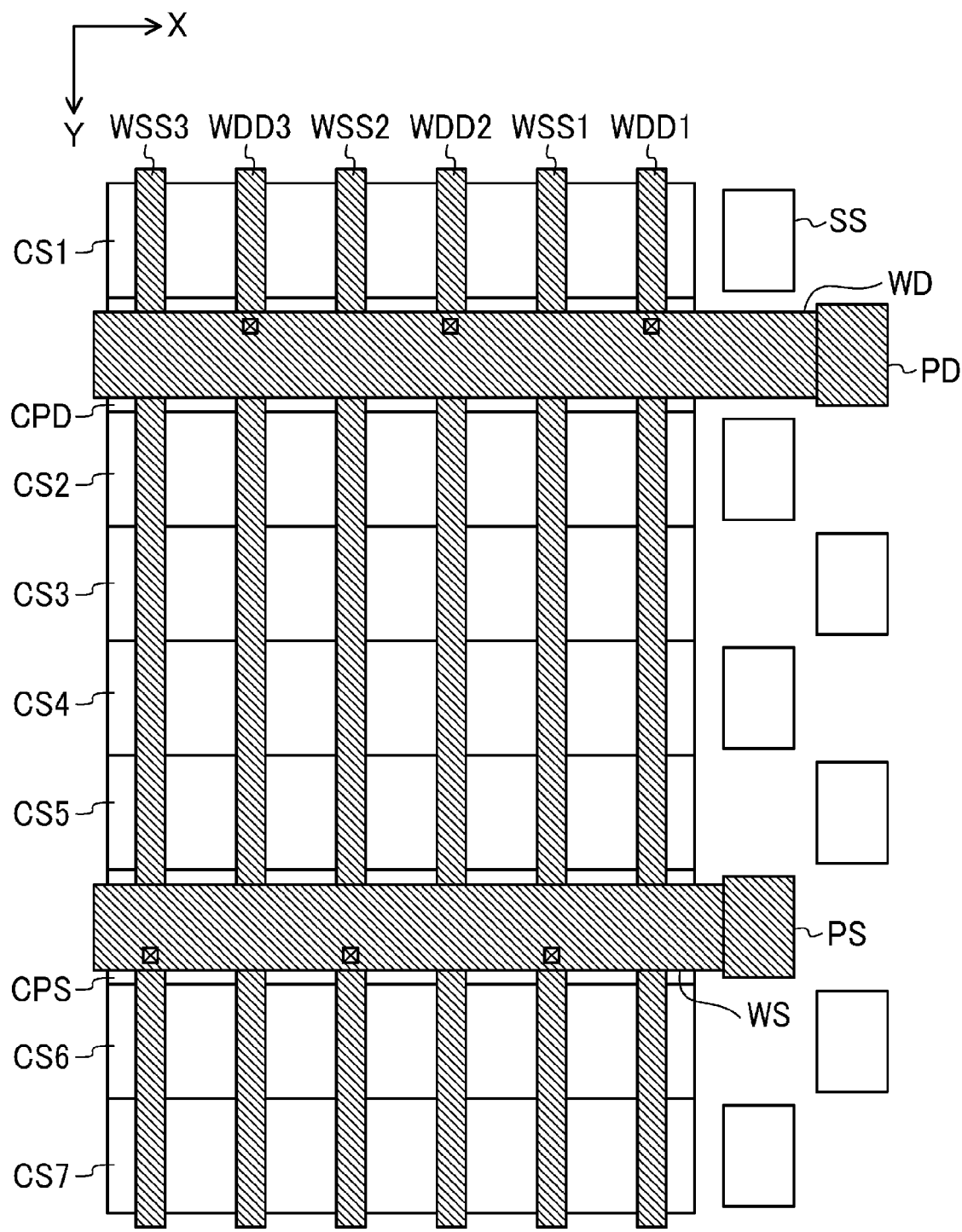
FIG. 3 is a plan view illustrating the arrangement of I/O cells.

Next, with reference to FIG. 3, the arrangement of the I/O cells illustrated in FIG. 1 will be described. In FIG. 3, an X-axis direction is a direction toward the outside of the semiconductor integrated circuit device from the internal circuit IC when viewed in plan. The I/O cells (two power supply cells CPD and CPS and seven signal input/output cells CS1-CS7 in the present embodiment) are arranged in a predetermined cell arrangement direction (a Y-axis direction orthogonal to the X-axis direction in the present embodiment). The cell height direction of the I/O cells corresponds to the X-axis direction. The cell width direction of the I/O cells corresponds to the Y-axis direction.

A plurality of power interconnects and ground interconnects extending in the X-axis direction and a plurality of power supply interconnects and ground supply interconnects extending in the Y-axis direction are provided above a row of the I/O cells (in an upper portion of the semiconductor integrated circuit device in the stacking direction). In the present embodiment, a power interconnect WD, a ground interconnect WS, three power supply interconnects WDD1-WDD3, and three ground supply interconnects WSS1-WSS3 are provided. The power interconnect WD and the ground interconnect WS are arranged above the power supply interconnects WDD1-WDD3 and the ground supply interconnects WSS1-WSS3 (in an upper portion of the semiconductor integrated circuit device in the stacking direction). The power supply pad PD and the ground pad PS are arranged above the power interconnect WD and the ground interconnect WS, respectively. Note that in the following description, for simplicity, the power supply interconnects are collectively referred to as "power supply interconnect(s) WDD" and the ground supply interconnects are collectively referred to as "ground supply interconnect(s) WSS."

<<Power Interconnect, Ground Interconnect>>

The power interconnect WD extends in the X-axis direction such that part of the power interconnect WD and the power supply pad PD overlap each other when viewed in plan. The power interconnect WD is electrically connected to each of the power supply interconnects WDD1-WDD3 through a via (a conductor for electrically connecting the interconnect layers to each other in the present embodiment). The ground interconnect WS extends in the X-axis direction such that part of the ground interconnect WS and the ground pad PS overlap each other when viewed in plan. The ground interconnect WS is electrically connected to each of the ground supply interconnects WSS1-WSS3 through a via. Note that in order to reduce electrical resistance between the power interconnect WD and each power supply interconnect WDD, the power interconnect WD may be electrically connected to each power supply interconnect WDD through a plurality of vias. The same applies to the electrical connection between the ground interconnect WS and each ground supply interconnect WSS. Moreover, the power interconnect WD and the ground interconnect WS may be formed in an interconnect layer (e.g., an uppermost one of the interconnect layers) in which the electrode pads (the power supply pads PD, the ground pads PS, and the signal pads SS) are formed. Signal interconnects for electrically connecting the signal pads SS to the signal cells CS may be further formed in the interconnect layer in which the electrode pads are formed.

<<Power Supply Interconnect, Ground Supply Interconnect>>

Each of the power supply interconnects WDD1-WDD3 and the ground supply interconnects WSS1-WSS3 is made of at least one interconnect layer. The power supply interconnects WDD and the ground supply interconnects WSS are electrically connected to the power supply cells CPD and CPS and components of the signal input/output cells CS1-CS7 through contacts (conductors for electrically connecting the element formation layer to the interconnect layer in the present embodiment). With this configuration, the power supply voltage VDD and the ground voltage VSS are supplied to the components of the power supply cells CPD and CPS and the signal input/output cells CS1-CS7. Note that the components of the power supply cells CPD and CPS and the signal input/output cells CS1-CS7 may include components directly connected neither to the power supply interconnects WDD nor to the ground supply interconnects WSS. Alternatively, in order to reduce electrical resistance between each power supply interconnect WDD and components of an I/O cell (e.g., components of the power supply cell CPD), the power supply interconnect WDD may be electrically connected to the components of the I/O cell through a plurality of contacts. The same applies to the ground supply interconnects WSS.

[Components of I/O Cell]

Next, with reference to FIG. 4, the components of the I/O cells illustrated in FIG. 1 will be described. Each of the power supply cells CPD and CPS includes the resistive element 11, the protecting element 13, and the controller 14, which are components included in the ESD protection circuit (see FIG. 2), and an interconnect capacitor 100 serving as the capacitive element 12, which is a component included in the ESD protection circuit. In each of the power supply cells CPD and CPS, the resistive element 11, the protecting element 13, and the controller 14 are formed in the element formation layer, and the interconnect capacitor 100 is provided in the plurality of interconnect layers. On the other hand, each of the signal input/output cells CS1-CS7 includes, for example, an NMOS transistor NMT and a PMOS transistor PMT which are components included in an input/output buffer circuit. The NMOS transistor NMT and the PMOS transistor PMT of each of the signal input/output cells CS1-CS7 are formed in the element formation layer.

[Configuration of Power Supply Cell]

Figure 5A:
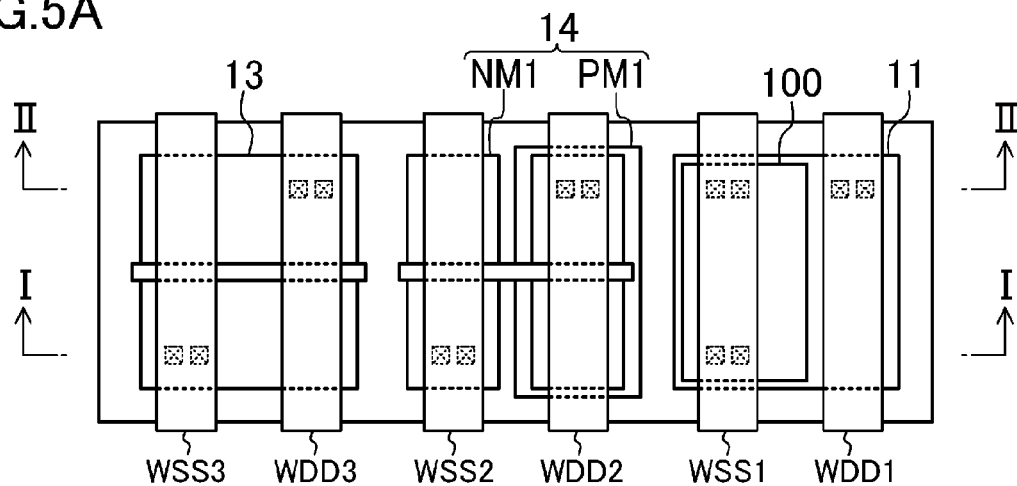
FIG. 5A is a plan view illustrating an example plan configuration of a power supply cell according to the first embodiment.
Figure 5B:
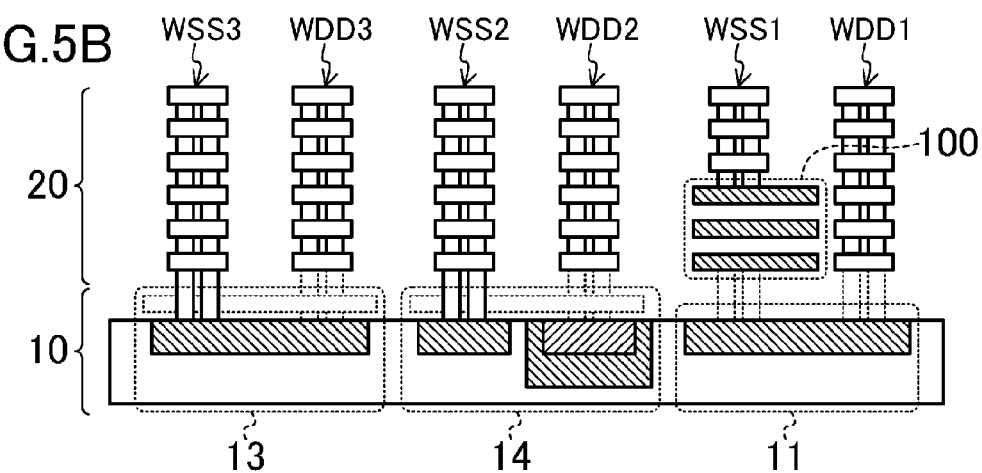
FIG. 5B is a cross-sectional view illustrating an example cross-sectional configuration along the line I-I of the power supply cell of FIG. 5A.
Figure 5C:
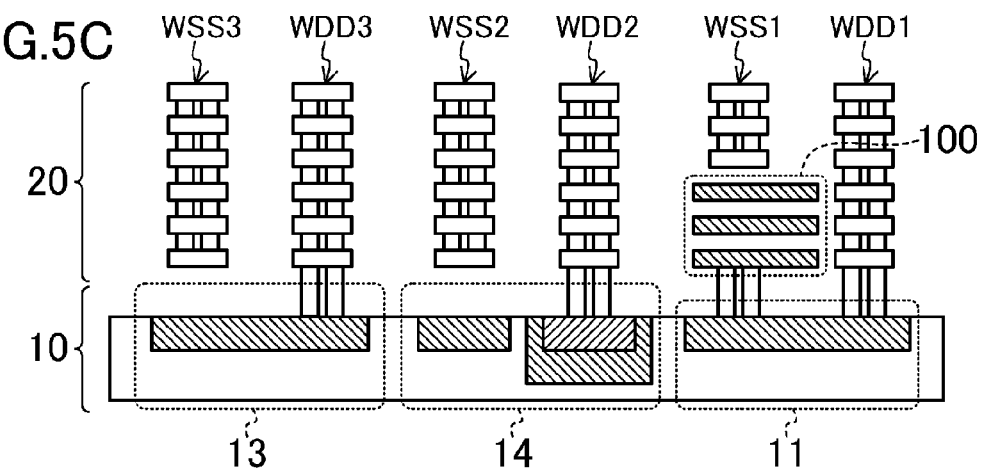
FIG. 5C is a plan view illustrating an example cross-sectional configuration along the line II-II of the power supply cell of FIG. 5A.

FIG. 5A illustrates an example plan configuration of the power supply cell (e.g., the power supply cell CPD or CPS) according to the first embodiment. FIGS. 5B and FIG. 5C illustrate example cross-sectional configurations respectively along the lines I-I and II-II of the power supply cell of FIG. 5A. Note that in FIGS. 5A-5C, for the convenience of the description, illustration of the power interconnect WD (or the ground interconnect WS) is omitted. In the power supply cell, the resistive element 11, the protecting element 13, and the controller 14, which are components included in the ESD protection circuit (see FIG. 2), are formed in an element formation layer 10. At least part of the capacitive element 12 (the entirety of the capacitive element 12 in the present embodiment), which is a component included in the ESD protection circuit, includes the interconnect capacitor 100. The interconnect capacitor 100 is provided in the plurality of interconnect layers 20. When viewed in plan, at least part of a region in which the interconnect capacitor 100 is formed (capacitance formation region) overlaps at least part of a region in which the resistive element 11, protecting element 13, and the controller 14 are formed (element formation region). In the present embodiment, the capacitance formation region overlaps, when viewed in plan, part of a region in which the resistive element 11 is formed.

[The Number of Interconnect Layers]

Next, with reference to FIGS. 4, 6A, and 6B, the number of interconnect layers included in each power supply interconnect WDD and each ground supply interconnect WSS will be described. In the present embodiment, the power supply interconnect WDD1 and the ground supply interconnect WSS1 will be described as an example. As illustrated in FIG. 4, the power supply interconnect WDD1 does not overlap parts of the power supply cells CPD and CPS (which correspond to regions in which the interconnect capacitors 100 will be formed in the present embodiment, specifically, the region in which the resistive element 11 is formed) when viewed in plan, whereas the ground supply interconnect WSS1 has interconnect portions overlapping the parts of the power supply cells CPD and CPS (overlapping interconnect portions) when viewed in plan.

Figure 4:
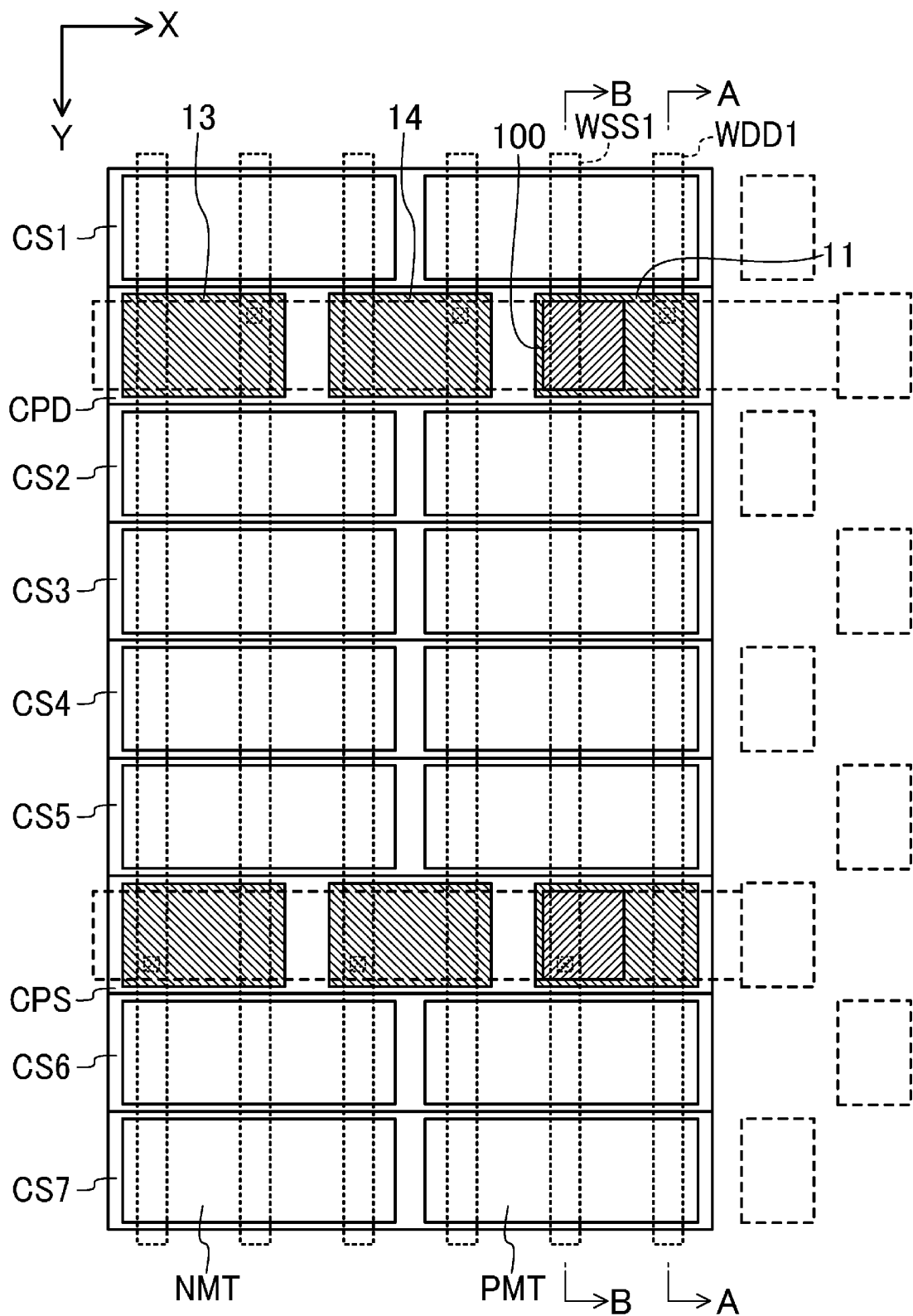
FIG. 4 is a plan view illustrating components of each of the I/O cell.

FIG. 6A illustrates an example cross-sectional configuration along the line A-A of the I/O cell row of FIG. 4. FIG. 6B illustrates an example cross-sectional configuration along the line B-B of the I/O cell row of FIG. 4. As illustrated in FIG. 6A, the power supply interconnect WDD1 includes seven interconnect layers in both regions corresponding to the power supply cells CPD and CPS and regions corresponding to the signal input/output cells CS1-CS7. On the other hand, as illustrated in FIG. 6B, the overlapping interconnect portions (interconnect portions overlapping, when viewed in plan, regions in which the interconnect capacitor 100 will be formed) of the ground supply interconnect WSS1 include four interconnect layers, and a non-overlapping interconnect portion of the ground supply interconnect WSS1 except for the overlapping interconnect portions includes seven interconnect layers. That is, the number of the interconnect layers included in the overlapping interconnect portions is smaller than the number of the interconnect layers included in the non-overlapping interconnect portion. The overlapping interconnect portions are portions of the ground supply interconnect WSS1 which overlap the parts of the power supply cells CPD and CPS when viewed in plan. The non-overlapping interconnect portion is a portion of the ground supply interconnect WSS1 except for the overlapping interconnect portions. The interconnect capacitors 100 are formed in regions of a plurality of interconnect layers 20, the regions overlapping the parts of the power supply cells CPD and CPS when viewed in plan.

As described above, the interconnect capacitor 100 is formed above each resistive element 11 (in an upper portion of the semiconductor integrated circuit device in the stacking direction). In general, in portions of the plurality of interconnect layers 20 which overlap, when viewed in plan, a region in which the resistive element 11 is formed, part of the portions of the interconnect layers 20 is used to electrically connect the resistive element 11 to a component (e.g., the power supply interconnect WDD), but the other parts of the plurality of interconnect layers 20 remain unused. Therefore, the portions of the plurality of interconnect layers 20 which overlap, when viewed in plan, the region in which the resistive element 11 is formed, can be effectively used as the interconnect capacitor 100. With this configuration, since one or more interconnect layers above the resistive element 11 can be effectively used as the interconnect capacitor 100, it is possible to reduce an increase in area caused by an increase in the capacitance value of the capacitive element 12 included in the ESD protection circuit compared to the case where the capacitive element 12 is formed in the element formation layer 10.

When the interconnect width and the interconnect pitch are smaller, the capacitance value of the interconnect resistor 100 can be higher. For example, when the interconnect width and the interconnect pitch are reduced according to an advance in microfabrication technology for semiconductor processes, at least part of the capacitive element 12 is formed by the interconnect capacitor 100, so that the capacitance value of the capacitive element 12 per unit area can be increased compared to the capacitance value in the case where the capacitive element 12 is formed by a MOS capacitor, which may reduce an increase in area caused by an increase in the capacitance value of the capacitive element 12 included in the ESD protection circuit.

In the I/O cell row illustrated in FIG. 4, the cell height of the signal input/output cells CS1-CS7 depends on the cell height of the power supply cells CPD and CPS. Thus, a space area may be formed in each of the signal input/output cells CS1-CS7. Note that in the power supply cell illustrated in FIGS. 5A-5C, since it is possible to reduce an increase in area of the power supply cell (power supply cells CPD and CPS in FIG. 4) caused by an increase in the capacitance value of the capacitive element included in the ESD protection circuit, the space area in the signal input/output cell can be reduced, so that the total area of I/O cell regions (regions in which the I/O cells are formed) can be reduced.

When the number of interconnect layers included in an overlapping interconnect portion is smaller than the number of interconnect layers included in a non-overlapping interconnect portion, it is possible to increase the number of interconnect layers which can be effectively used as the interconnect capacitor 100, where the overlapping interconnect portion is a portion of the power supply interconnect WDD (or the ground supply interconnect WSS) which overlaps part of the power supply cell when viewed in plan, and the non-overlapping interconnect portion is a portion of the power supply interconnect WDD (or the ground supply interconnect WSS) except the overlapping interconnect portion. For example, when a current consumed by components in an I/O cell is small, or when the cell height of the I/O cell is large and the interconnect width of a power supply interconnect WDD (or a ground supply interconnect VSS) is sufficiently ensured, it is possible to reduce the number of interconnect layers included in an overlapping interconnect portion of the power supply interconnect WDD (or the ground supply interconnect WSS), where the overlapping interconnect portion is a portion of the power supply interconnect WDD (or the ground supply interconnect WSS) which overlaps part of the power supply cell when viewed in plan.

(Example Configuration of Interconnect Capacitor)

The interconnect capacitor 100 can be configured by arranging a plurality of interconnects to be separated from each other such that an interconnect capacitor is provided in the plurality of interconnect layers 20. Here, several example configurations of the interconnect capacitor will be described.

[First Example Configuration of Interconnect Capacitor]

First, with reference to FIGS. 7A-7C and FIGS. 8A-8C, a first example configuration of the interconnect capacitor will be described. FIGS. 7A, 7B, and 7C illustrate example plan configurations respectively of Xth, (X+1)th, and (X+2)th interconnect layers 111, 112, and 113 over which the interconnect capacitor 100 extends. FIGS. 8A, 8B, and 8C illustrate example cross-sectional configurations respectively along the lines I-I, II-II, and III-III of the interconnect capacitor of FIG. 7A. The interconnect layer 111 includes capacitance interconnects 111a and 111b. The interconnect layer 112 includes capacitance interconnects 112a and 112b. The interconnect layer 113 includes capacitance interconnects 113a and 113b.

The capacitance interconnects 111a and 111b are separated from each other when viewed in plan and extend in a first direction D1. Each of the capacitance interconnects 111a and 111b includes a plurality of interconnect portions extending in a second direction D2 orthogonal to the first direction D1. That is, the capacitance interconnects 111a and 111b have a comb shape when viewed in plan. The capacitance interconnects 111a and 111b are formed such that each of the interconnect portions of the capacitance interconnect 111b is arranged between adjacent ones of the interconnect portions of the capacitance interconnect 111a when viewed in plan. The capacitance interconnects 112a and 113a have configurations similar to the configuration of the capacitance interconnect 111a, and the capacitance interconnects 112b and 113b have configurations similar to the configuration of the capacitance interconnect 111b.

The capacitance interconnects 111a, 112a, and 113a overlap each other when viewed in plan, and are electrically connected to each other through vias. Similar to the capacitance interconnects 111a, 112a, and 113a, the capacitance interconnects 111b, 112b, and 113b overlap each other when viewed in plan, and are electrically connected to each other through vias. A combination of the capacitance interconnects 111a, 112a, and 113a (a first interconnect combination) is electrically connected to the ground supply interconnect WSS through vias. A combination of the capacitance interconnects 111b, 112b, and 113b (a second interconnect combination) is electrically connected to the resistive element 11 through contacts.

With this configuration, the area of the capacitance interconnects can be reduced compared to the case where a parallel flat plate-type capacitor is formed by providing a flat plate capacitance interconnect to each of adjacent interconnect layers. Moreover, the interconnect layers 111, 112, and 113 are stacked, so that it is possible to increase the capacitance value of the interconnect capacitor per unit area. Note that the first interconnect combination may be electrically connected to the resistive element 11, and the second interconnect combination may be electrically connected to the ground supply interconnect WSS. The same applies to the following description.

[Second Example Configuration of Interconnect Capacitor]

Next, with reference to FIGS. 9A-9C and FIGS. 10A-10C, a second example configuration of the interconnect capacitor will be described. FIGS. 9A, 9B, and 9C illustrate example plan configurations respectively of Xth, (X+1)th, and (X+2)th interconnect layers 121, 122, and 123 over which the interconnect capacitor 100 extends. FIGS. 10A, 10B, and 10C illustrate example cross-sectional configurations respectively along the lines I-I, II-II, and III-III of the interconnect capacitor of FIG. 9A. The interconnect layer 121 includes capacitance interconnects 121a and 121b. The interconnect layer 122 includes capacitance interconnects 122a and 122b. The interconnect layer 123 includes capacitance interconnects 123a and 123b.

The capacitance interconnects 121a and 121b have configurations similar to the configurations of the capacitance interconnects 111a and 111b of FIG. 7A. The capacitance interconnects 123a and 123b have configurations similar to the configurations of the capacitance interconnects 113a and 113b of FIG. 7C. Similar to the capacitance interconnects 121a and 121b, the capacitance interconnects 122a and 122b have a comb shape. The capacitance interconnects 122a and 122b are formed such that each of a plurality of interconnect portions of the capacitance interconnect 122b is arranged between adjacent ones of a plurality of interconnect portions of the capacitance interconnect 122a when viewed in plan. The capacitance interconnect 122a is formed such that the plurality of interconnect portions of the capacitance interconnect 122a and a plurality of interconnect portions of the capacitance interconnects 121b and 123b overlap each other when viewed in plan. The capacitance interconnect 122b is formed such that the plurality of interconnect portions of the capacitance interconnect 122b and a plurality of interconnect portions of the capacitance interconnects 121a and 123a overlap each other when viewed in plan.

A combination of the capacitance interconnects 121a, 122a, and 123a (a first interconnect combination) is electrically connected to the ground supply interconnect WSS. A combination of the capacitance interconnects 121b, 122b, and 123b (a second interconnect combination) is electrically connected to the resistive element 11.

With this configuration, an interconnect capacitor can be formed not only between adjacent interconnects in an interconnect layer (e.g., between the capacitance interconnects 121a and 121b) but also between adjacent interconnect layers (e.g., between the capacitance interconnects 121a and 122b). Thus, the capacitance value of the interconnect capacitor per unit area can be increased compared to the capacitance value in the first example configuration of the interconnect capacitor of FIGS. 7A-7C.

[Third Example Configuration of Interconnect Capacitor]

Figure 12A:
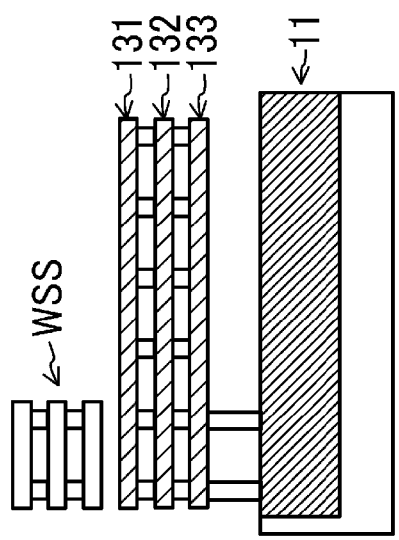
FIGS. 12A-12C are cross-sectional views illustrating the third example configuration of the interconnect capacitor.
Figure 12B:
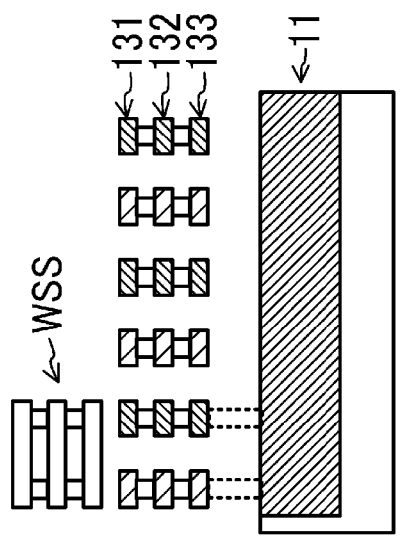
Figure 12C:
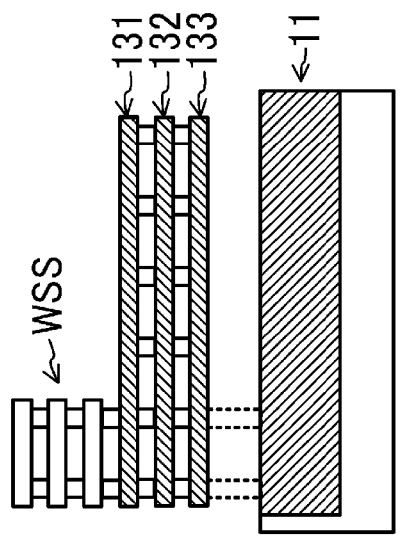

Next, with reference to FIGS. 11A-11C and FIGS. 12A-12C, a third example configuration of the interconnect capacitor will be described. FIGS. 11A, 11B, and 11C illustrate example plan configurations respectively of Xth, (X+1)th, and (X+2)th interconnect layers 131, 132, and 133 over which the interconnect capacitor 100 extends. FIGS. 12A, 12B, and 12C illustrate example cross-sectional configurations respectively along the lines I-I, II-II, and III-III of the interconnect capacitor of FIG. 11A. The interconnect layer 131 includes capacitance interconnects 131a and 131b. The interconnect layer 132 includes capacitance interconnects 132a and 132b. The interconnect layer 133 includes capacitance interconnects 133a and 133b.

The capacitance interconnects 131a and 131b have configurations similar to the configurations of the capacitance interconnects 111a and 111b of FIG. 7A. The capacitance interconnects 132a and 132b have configurations similar to the configurations of the capacitance interconnect 112a and 112b of FIG. 7B. The capacitance interconnects 133a and 133b have configurations similar to the configurations of the capacitance interconnects 113a and 113b of FIG. 7C. A plurality of vias for electrically connecting the capacitance interconnects 131a, 132a, and 133a to each other are formed in a plurality of interconnect portions of the capacitance interconnects 131a, 132a, and 133a. Similar to the capacitance interconnects 131a, 132a, and 133a, a plurality of vias for electrically connecting the capacitance interconnects 131b, 132b, and 133b to each other are formed in a plurality of interconnect portions of the capacitance interconnects 131b, 132b, and 133b.

A combination of the capacitance interconnects 131a, 132a, and 133a (a first interconnect combination) is electrically connected to the ground supply interconnect WSS. A combination of the capacitance interconnects 131b, 132b, and 133b (a second interconnect combination) is electrically connected to the resistive element 11.

With this configuration, since fringe capacitors in the periphery of the vias are added as interconnect capacitors, it is possible to increase the capacitance value of the interconnect capacitor per unit area compared to the first example configuration of the interconnect capacitor of FIGS. 7A-7C.

[Fourth Example Configuration of Interconnect Capacitor]

Figure 14A:
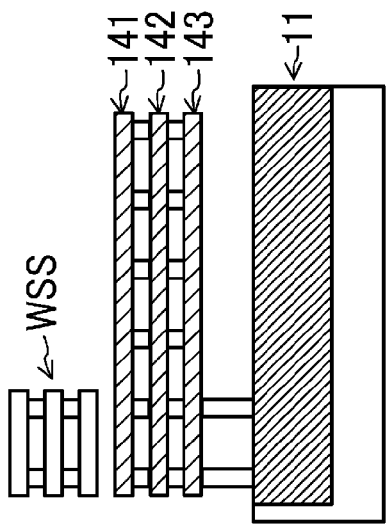
FIGS. 14A-14C are cross-sectional views illustrating the fourth example configuration of the interconnect capacitor.
Figure 14B:
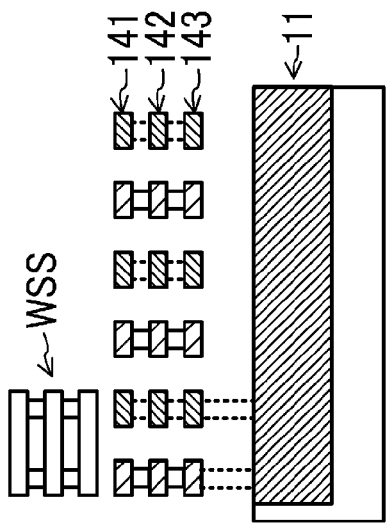
Figure 14C:
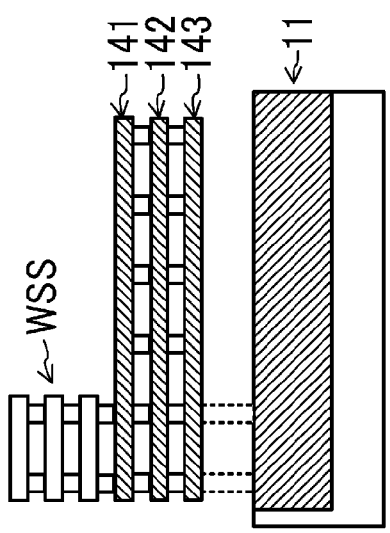

Next, with reference to FIGS. 13A-13C and FIGS. 14A-14C, a fourth example configuration of the interconnect capacitor will be described. FIGS. 13A, 13B, and 13C illustrate example plan configurations respectively of Xth, (X+1)th, and (X+2)th interconnect layers 141, 142, and 143 included in the interconnect capacitor 100. FIGS. 14A, 14B, and 14C illustrate example cross-sectional configurations respectively along the lines I-I, II-II, and III-III of the interconnect capacitor of FIG. 13A. The interconnect layer 141 includes capacitance interconnects 141a and 141b. The interconnect layer 142 includes capacitance interconnects 142a and 142b. The interconnect layer 143 includes capacitance interconnects 143a and 143b.

The capacitance interconnects 141a and 141b have configurations similar to the configurations of the capacitance interconnects 111a and 111b of FIG. 7A. The capacitance interconnects 142a and 142b have configurations similar to the configurations of the capacitance interconnects 112a and 112b of FIG. 7B. The capacitance interconnects 143a and 143b have configurations similar to the configurations of the capacitance interconnects 113a and 113b of FIG. 7C. Similar to the capacitance interconnects 131a-133a and 131b-133b of FIGS. 11A-11C, a plurality of vias are formed in a plurality of interconnect portions of the capacitance interconnects 141a-143a and 141b-143b. Note that the distance between the vias of the capacitance interconnects 141a-143a and 141b-143b is larger than the distance between the vias of the capacitance interconnects 131a-133a and 131b-133b of FIGS. 11A-11C.

A combination of the capacitance interconnects 141a, 142a, and 143a (a first interconnect combination) is electrically connected to the ground supply interconnect WSS. A combination of the capacitance interconnects 141b, 142b, and 143b (a second interconnect combination) is electrically connected to the resistive element 11.

Also with this configuration, since fringe capacitors in the periphery of the vias are added as interconnect capacitors, it is possible to increase the capacitance value of the interconnect capacitor per unit area compared to the first example configuration of the interconnect capacitor of FIGS. 7A-7C.

[Fifth Example Configuration of Interconnect Capacitor]

Next, with reference to FIGS. 15A-15C and FIGS. 16A-16C, a fifth example configuration of the interconnect capacitor will be described. FIGS. 15A, 15B, and 15C illustrate example plan configurations respectively of Xth, (X+1)th, and (X+2)th interconnect layers 151, 152, and 153 included in the interconnect capacitor 100. FIGS. 16A, 16B, and 16C illustrate example cross-sectional configurations respectively along the lines I-I, II-II, and III-III of the interconnect capacitor of FIG. 15A. The interconnect layer 151 includes capacitance interconnects 151a and 151b. The interconnect layer 152 includes capacitance interconnects 152a and 152b. The interconnect layer 153 includes capacitance interconnects 153a and 153b.

The capacitance interconnects 151a and 151b have configurations similar to the configurations of the capacitance interconnects 111a and 111b of FIG. 7A. The capacitance interconnects 152a and 152b have configurations similar to the configurations of the capacitance interconnect 112a and 112b of FIG. 7B. The capacitance interconnects 153a and 153b have configurations similar to the configurations of the capacitance interconnects 113a and 113b of FIG. 7C. Vias for electrically connecting the capacitance interconnects 151a, 152a, and 153a to each other are formed in a plurality of interconnect portions of the capacitance interconnects 151a, 152a, and 153a, the vias extending along the interconnect portions of the capacitance interconnects 151a, 152a, and 153a when viewed in plan. Similar to the capacitance interconnects 151a, 152a, and 153a, vias for electrically connecting the capacitance interconnects 151b, 152b, and 153b to each other are formed in a plurality of interconnect portions of the capacitance interconnects 151b, 152b, and 153b, the vias extending along the interconnect portions of the capacitance interconnects 151b, 152b, and 153b when viewed in plan.

A combination of the capacitance interconnects 151a, 152a, and 153a (a first interconnect combination) is electrically connected to the ground supply interconnect WSS. A combination of the capacitance interconnects 151b, 152b, and 153b (a second interconnect combination) is electrically connected to the resistive element 11.

Also with this configuration, since fringe capacitors in the periphery of the vias are added as interconnect capacitors, it is possible to increase the capacitance value of the interconnect capacitor per unit area compared to the first example configuration of the interconnect capacitor of FIGS. 7A-7C.

[Sixth Example Configuration of Interconnect Capacitor]

Figure 18A:
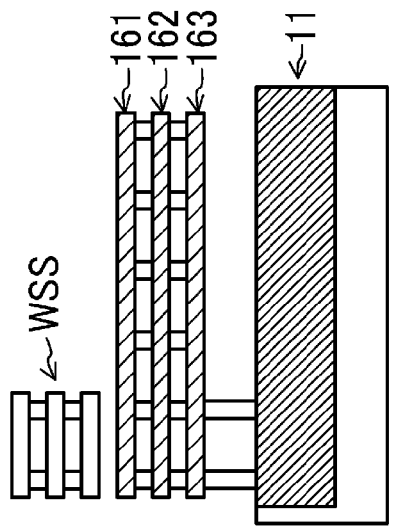
FIGS. 18A-18C are cross-sectional views illustrating the sixth example configuration of the interconnect capacitor.
Figure 18B:
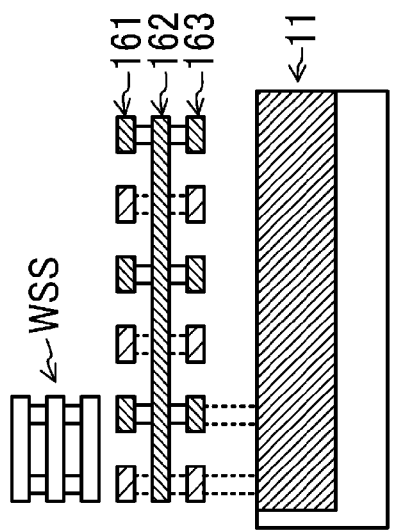
Figure 18C:
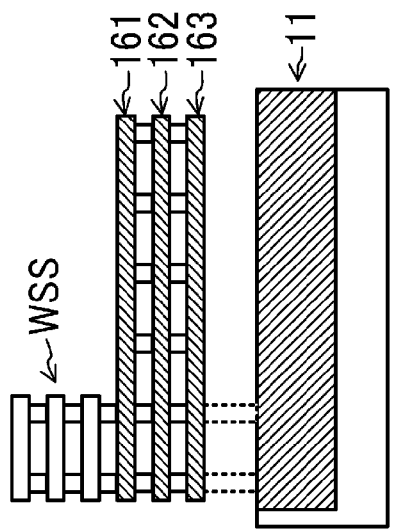

Next, with reference to FIGS. 17A-17C and FIGS. 18A-18C, a sixth example configuration of the interconnect capacitor will be described. FIGS. 17A, 17B, and 17C illustrate example plan configurations respectively of Xth, (X+1)th, and (X+2)th interconnect layers 161, 162, and 163 included in the interconnect capacitor 100. FIGS. 18A, 18B, and 18C illustrate example cross-sectional configurations respectively along the lines I-I, II-II, and III-III of the interconnect capacitor of FIG. 17A. The interconnect layer 161 includes capacitance interconnects 161a and 161b. The interconnect layer 162 includes capacitance interconnects 162a and 162b. The interconnect layer 163 includes capacitance interconnects 163a and 163b.

The capacitance interconnects 161a and 161b have configurations similar to the configurations of the capacitance interconnects 111a and 111b of FIG. 7A. The capacitance interconnects 163a and 163b have configurations similar to the configurations of the capacitance interconnect 113a and 113b of FIG. 7C. The capacitance interconnect 162a includes a plurality of interconnect portions separated from each other when viewed in plan and extending in a first direction D1. The capacitance interconnect 162b includes a plurality of interconnect portions separated from each other when viewed in plan and extending in the first direction D1. The capacitance interconnect 162a is electrically connected to the capacitance interconnects 161a and 163a through a plurality of vias. The capacitance interconnect 162b is electrically connected to the capacitance interconnects 161b and 163b through a plurality of vias.

A combination of the capacitance interconnects 161a, 162a, and 163a (a first interconnect combination) is electrically connected to the ground supply interconnect WSS. A combination of the capacitance interconnects 161b, 162b, and 163b (a second interconnect combination) is electrically connected to the resistive element 11.

With the above configuration, an interconnect capacitor can be formed not only between adjacent interconnects in an interconnect layer (e.g., between the capacitance interconnects 161a and 161b) but also between adjacent interconnect layers (e.g., between the capacitance interconnects 161a and 162b). Moreover, since fringe capacitors in the periphery of the vias are added as interconnect capacitors, it is possible to increase the capacitance value of the interconnect capacitor per unit area compared to the capacitance value in the first example configuration of the interconnect capacitor of FIGS. 7A-7C.

[Seventh Example Configuration of Interconnect Capacitor]

Figure 19A:
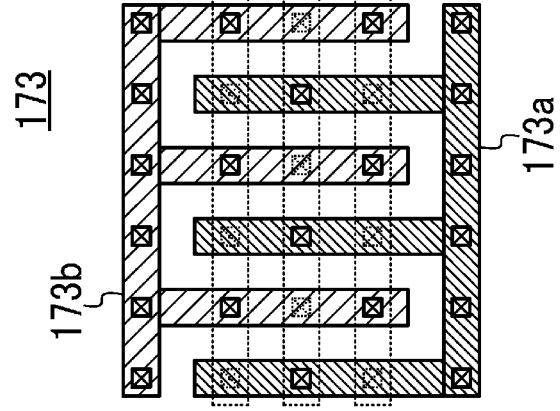
FIGS. 19A-19C are plan views illustrating a seventh example configuration of the interconnect capacitor.
Figure 19B:
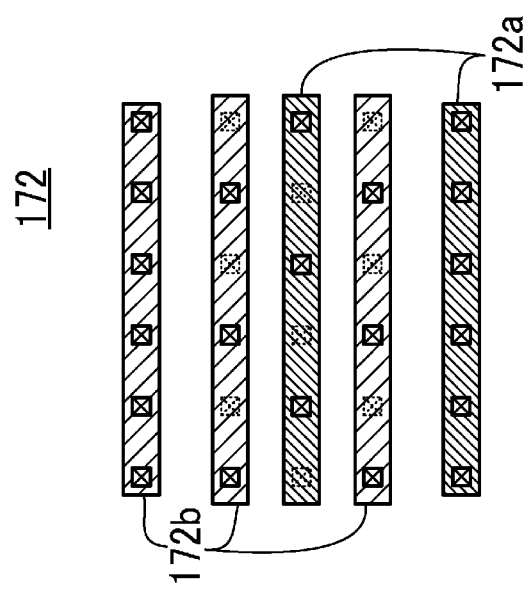
Figure 19C:
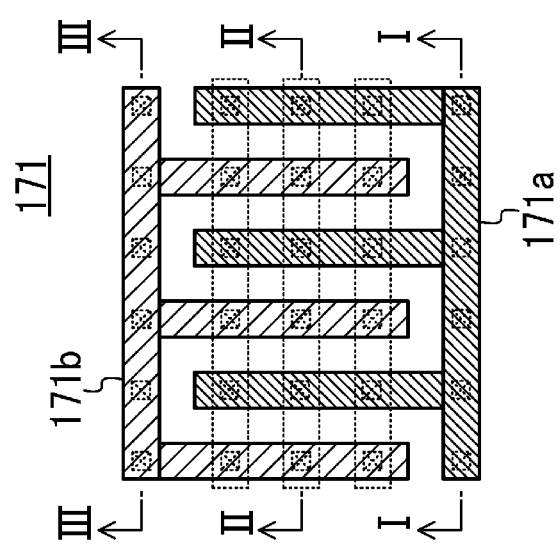

Next, with reference to FIGS. 19A-19C and FIGS. 20A-20C, a seventh example configuration of the interconnect capacitor will be described. FIGS. 19A, 19B, and 19C illustrate example plan configurations respectively of Xth, (X+1)th, and (X+2)th interconnect layers 171, 172, and 173 included in the interconnect capacitor 100. FIGS. 20A, 20B, and 20C illustrate example cross-sectional configurations respectively along the lines I-I, II-II, and III-III of the interconnect capacitor of FIG. 19A. The interconnect layer 171 includes capacitance interconnects 171a and 171b. The interconnect layer 172 includes capacitance interconnects 172a and 172b. The interconnect layer 173 includes capacitance interconnects 173a and 173b.

The capacitance interconnects 171a and 171b have configurations similar to the configurations of the capacitance interconnects 121a and 121b of FIG. 9A. The capacitance interconnects 172a and 172b have configurations similar to the configurations of the capacitance interconnect 162a and 162b of FIG. 17B. The capacitance interconnects 173a and 173b have configurations similar to the configurations of the capacitance interconnects 122a and 122b of FIG. 9B. The capacitance interconnect 172a is electrically connected to the capacitance interconnects 171a and 173a through a plurality of vias. The capacitance interconnect 172b is electrically connected to the capacitance interconnect 171b and 173b through a plurality of vias.

A combination of the capacitance interconnects 171a, 172a, and 173a (a first interconnect combination) is electrically connected to the ground supply interconnect WSS. A combination of the capacitance interconnects 171b, 172b, and 173b (a second interconnect combination) is electrically connected to the resistive element 11.

Also with this configuration, an interconnect capacitor can be formed not only between adjacent interconnects in an interconnect layer but also between adjacent interconnect layers. Moreover, since fringe capacitors in the periphery of the vias are added as interconnect capacitors, it is possible to increase the capacitance value of the interconnect capacitor per unit area compared to the capacitance value in the first example configuration of the interconnect capacitor of FIGS. 7A-7C.

Second Embodiment

Figure 21A:
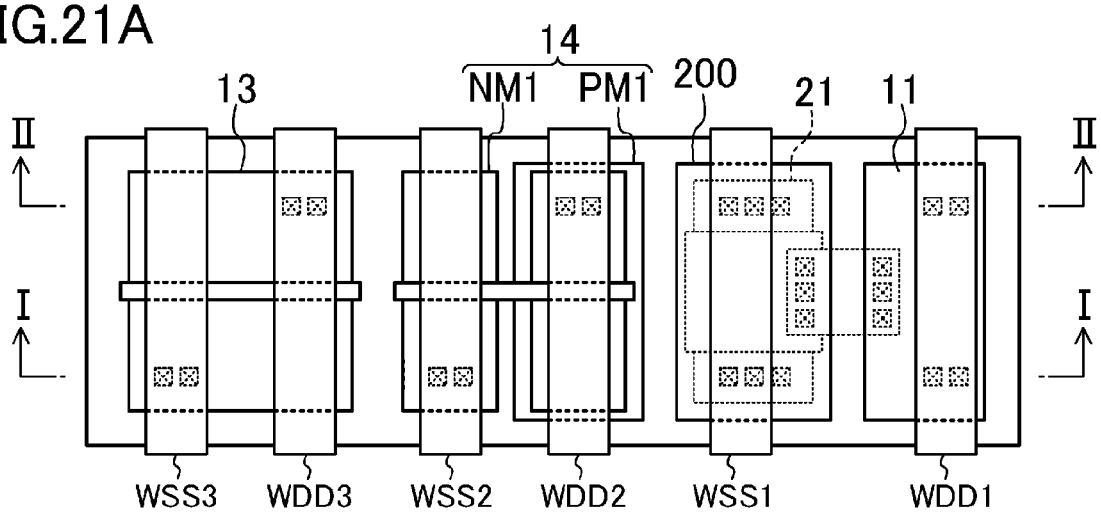
FIG. 21A is a plan view illustrating an example plan configuration of a power supply cell according to a second embodiment.
Figure 21B:
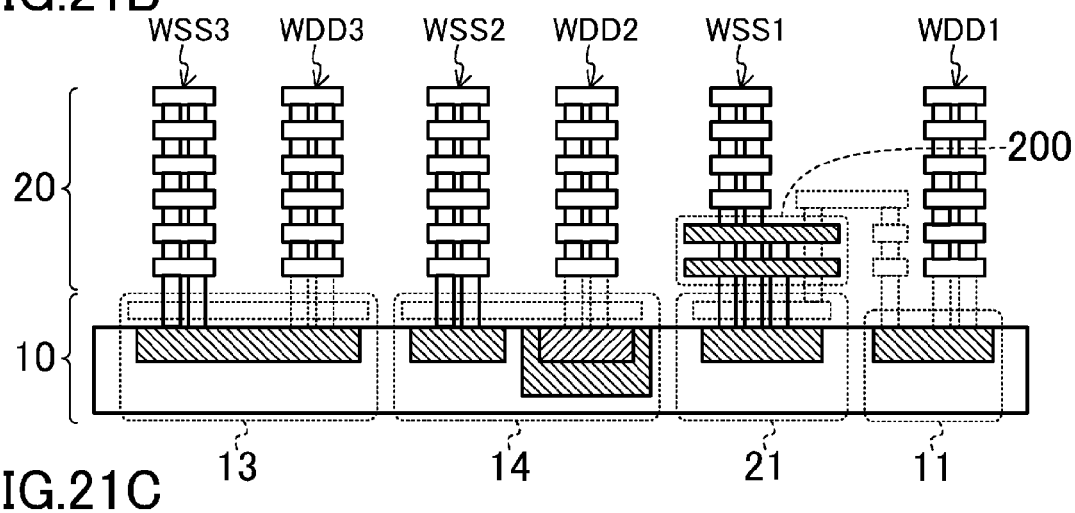
FIG. 21B is a cross-sectional view illustrating an example cross-sectional configuration along the line I-I of the power supply cell of FIG. 21A.
Figure 21C:
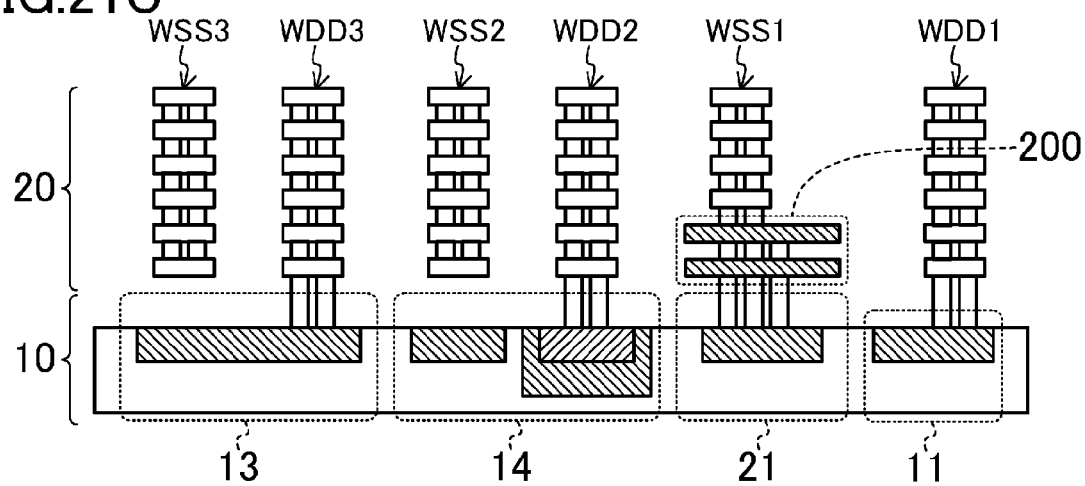
FIG. 21C is a cross-sectional view illustrating an example cross-sectional configuration along the line II-II of the power supply cell of FIG. 21A.

A semiconductor integrated circuit device according to a second embodiment includes power supply cells as illustrated in FIGS. 21A-21C instead of power supply cells as illustrated in FIGS. 5A-5C. The other configurations are the same as those of the semiconductor integrated circuit device according to the first embodiment.

[Power Supply Cell]

FIG. 21A illustrates an example plan configuration of a power supply cell according to the second embodiment. FIGS. 21B and FIG. 21C illustrate example cross-sectional configurations respectively along the lines I-I and II-II of the power supply cell of FIG. 21A. Note that in FIGS. 21A-21C, for the convenience of the description, illustration of a power interconnect WD (or a ground interconnect WS) is omitted. In the power supply cell, a resistive element 11, a protecting element 13, and a controller 14, which are components included in an ESD protection circuit (see FIG. 2), are formed in an element formation layer 10. A capacitive element 12, which is a component included in the ESD protection circuit, includes an interconnect capacitor 200 and a MOS capacitor 21. The interconnect capacitor 200 is provided in a plurality of interconnect layers 20. The MOS capacitor 21 is formed in the element formation layer 10. Moreover, at least part of a region in which the interconnect capacitor 200 is formed (capacitance formation region) overlaps, when viewed in plan, at least part of a region in which the resistive element 11, protecting element 13, the controller 14, and the MOS capacitor 21 are formed (element formation region). In the present embodiment, the capacitance formation region overlaps, when viewed in plan, a region in which the MOS capacitor 21 is formed. For example, the MOS capacitor 21 is a capacitor in which a gate electrode of a MOS transistor serves as one of electrodes, and a combination of a source electrode, a drain electrode, and a back gate electrode of the MOS transistor serves as the other of the electrodes.

As described above, the interconnect capacitor 200 is formed above the MOS capacitor 21 (in an upper portion of the semiconductor integrated circuit device in the stacking direction). In general, in portions of the plurality of interconnect layers 20 which overlap, when viewed in plan, a region in which the MOS capacitor 21 is formed, part of the portions of the interconnect layers 20 is used to electrically connect the MOS capacitor 21 to a component (e.g., the resistive element 11), but the other parts of the plurality of interconnect layers 20 remain unused. Therefore, the portions of the plurality of interconnect layers 20 which overlap, when viewed in plan, the region in which the MOS capacitor 21 is formed, can be effectively used as the interconnect capacitor 200. With this configuration, since one or more interconnect layers arranged above the MOS capacitor 21 can be effectively used as the interconnect capacitor 200, it is possible to reduce an increase in area caused by an increase in the capacitance value of the capacitive element 12 included in the ESD protection circuit compared to the case where the capacitive element 12 is formed by the MOS capacitor 21.

In a currently used typical semiconductor processes, the capacitance value of the MOS capacitor per unit area is in many cases higher than the capacitance value of the interconnect capacitor 200 per unit area. Therefore, when the capacitive element 12 includes the MOS capacitor 21 and the interconnect capacitor 200, it is possible to increase the capacitance value of the capacitive element 12, which is a component of the ESD protection circuit.

[First Example Configurations of Interconnect Capacitor and MOS Capacitor]

Figure 22A:
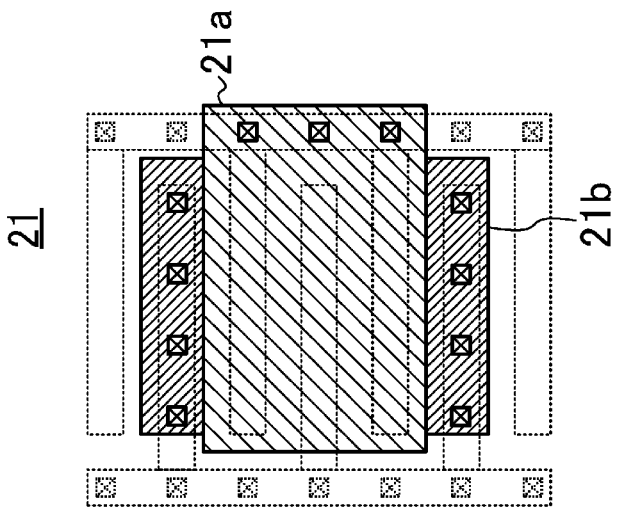
FIGS. 22A-22C are plan views illustrating a first example configuration of interconnect capacitor and MOS capacitor.
Figure 22B:
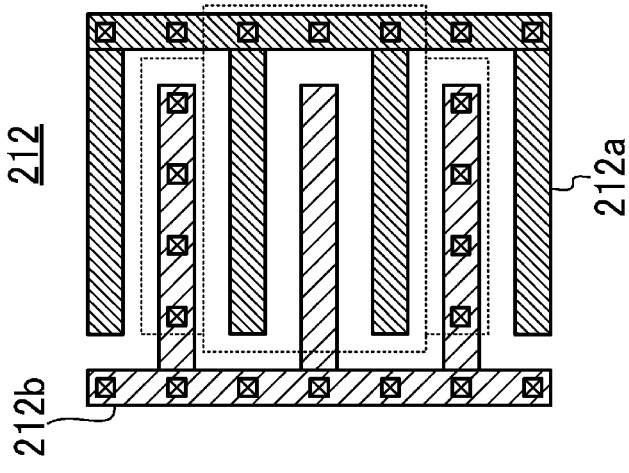
Figure 22C:
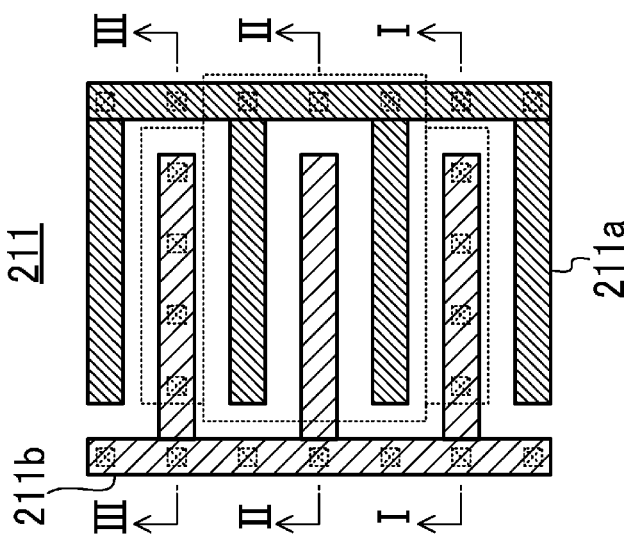

Here, with reference to FIGS. 22A-22C and FIGS. 23A-23C, first example configurations of the interconnect capacitor and the MOS capacitor will be described. FIGS. 22A and 22B illustrate example plan configurations respectively of Xth and (X+1)th interconnect layers 211 and 212 included in the interconnect capacitor 200. FIG. 22C illustrates an example plan configuration of the MOS capacitor 21. FIGS. 23A, 23B, and 23C illustrate example cross-sectional configurations respectively along the lines I-I, II-II, and III-III of the interconnect capacitor 200 and the MOS capacitor 21 of FIG. 22A. The interconnect layer 211 includes capacitance interconnects 211a and 211b. The interconnect layer 212 includes capacitance interconnects 212a and 212b. The MOS capacitor 21 includes a gate electrode 21a and a diffusion region 21b.

The capacitance interconnects 211a and 211b are separated from each other when viewed in plan and extend in a first direction D1. Each of the capacitance interconnects 211a and 211b includes a plurality of interconnect portions extending in a second direction D2 orthogonal to the first direction D1. That is, the capacitance interconnects 211a and 211b have a comb shape when viewed in plan. The capacitance interconnects 211a and 211b are formed such that each of the plurality of interconnect portions of the capacitance interconnect 211b is arranged between adjacent ones of the plurality of interconnect portions of the capacitance interconnect 211a when viewed in plan. The capacitance interconnects 212a and 212b have similar configurations as the configurations of the capacitance interconnects 211a and 211b, respectively. A channel region is formed under the gate electrode 21a (in a lower portion of the semiconductor integrated circuit device in the stacking direction).

The capacitance interconnects 211a and 212a and the gate electrode 21a overlap each other when viewed in plan and are electrically connected to each other through vias and contacts. Similar to the capacitance interconnects 211a and 212a and the gate electrode 21a, the capacitance interconnects 211b and 212b and the diffusion region 21b overlap each other when viewed in plan and are electrically connected to each other through vias and contacts. A combination of the capacitance interconnects 211a and 212a and the gate electrode 21a is electrically connected to the resistive element 11. A combination of the capacitance interconnects 211b and 212b and the diffusion region 21b is electrically connected to a ground supply interconnect WSS. Note that the combination of the capacitance interconnects 211a and 212a and the gate electrode 21a may be electrically connected to the ground supply interconnect WSS, and the combination of the capacitance interconnects 211b and 212b and the diffusion region 21b may be electrically connected to the resistive element 11.

With this configuration, the area of the capacitance interconnects can be reduced compared to the case where a parallel flat plate-type capacitor is formed by providing a flat plate capacitance interconnect to each of adjacent interconnect layers. Note that the first to seventh example configurations of the interconnect capacitor (see FIGS. 7-20) may be provided instead of the interconnect layers 211 and 212.

[Second Example Configurations of Interconnect capacitor and MOS Capacitor]

Next, with reference to FIGS. 24A-24C, second example configurations of the interconnect capacitor and the MOS capacitor will be described. FIGS. 24A and 24B illustrate example plan configurations respectively of Xth and (X+1)th interconnect layers 221 and 222 included in the interconnect capacitor 200. FIG. 24C illustrates an example plan configuration of a MOS capacitor 22. The interconnect layer 221 includes capacitance interconnects 221a and 221b. The interconnect layer 222 includes capacitance interconnects 222a and 222b. The MOS capacitor 22 includes a diffusion region 22b and a back gate electrode 22c.

The capacitance interconnects 221a and 221b are separated from each other when viewed in plan and extend in a first direction D1. Each of the capacitance interconnects 221a and 221b includes a plurality of interconnect portions extending in a second direction D2 orthogonal to the first direction D1. That is, the capacitance interconnects 221a and 221b have a comb shape when viewed in plan. The capacitance interconnects 221a and 221b are formed such that each of the plurality of interconnect portions of the capacitance interconnect 221b is arranged between adjacent ones of the plurality of interconnect portions of the capacitance interconnect 221a when viewed in plan. The capacitance interconnects 222a and 222b have configurations similar to the configurations of the capacitance interconnects 221a and 221b, respectively. A channel region is formed under a gate electrode 22a (in a lower portion of the semiconductor integrated circuit device in the stacking direction). The back gate electrode 22c is formed to surround the gate electrode 22a and the diffusion region 22b when viewed in plan.

The capacitance interconnects 221a and 222a and the gate electrode 22a overlap each other when viewed in plan and are electrically connected to each other through vias and contacts. Similar to the capacitance interconnects 221a and 222a and the gate electrode 22a, the capacitance interconnects 221b and 222b and the diffusion region 22b (or the back gate electrode 22c) overlap each other when viewed in plan and are electrically connected to each other through vias and contacts. A combination of the capacitance interconnects 221a and 222a and the gate electrode 22a is electrically connected to the resistive element 11. A combination of the capacitance interconnects 221b and 222b, the diffusion region 22b, and the back gate electrode 22c is electrically connected to the ground supply interconnect WSS. Note that the combination of the capacitance interconnects 221a and 222a and the gate electrode 22a may be electrically connected to the ground supply interconnect WSS, and the combination of the capacitance interconnects 221b and 222b, the diffusion region 22b, and the back gate electrode 22c may be electrically connected to the resistive element 11.

With the above configuration, since the capacitance interconnects 221b and 222b can be provided also in a region in which the back gate electrode 22c is formed when viewed in plan, it is possible to increase an area in which the capacitance interconnect 221a and the capacitance interconnect 221b face each other and an area in which the capacitance interconnect 222a and the capacitance interconnect 222b face each other, so that the capacitance value of the interconnect capacitor per unit area can be increased compared to the first example configuration of the interconnect capacitor and the MOS capacitor of FIGS. 22A-22C. Note that any of the first to seventh example configurations (see FIGS. 7-20) of the interconnect capacitor may be provided instead of the interconnect layers 221 and 222.

[Third Example Configurations of Interconnect Capacitor and MOS Capacitor]

Figure 25C:
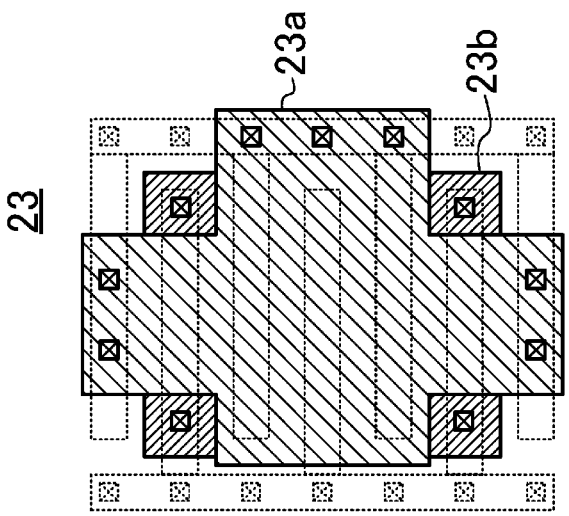
FIGS. 25A-25C are plan views illustrating a third example configuration of the interconnect capacitor and the MOS capacitor.
Figure 25B:
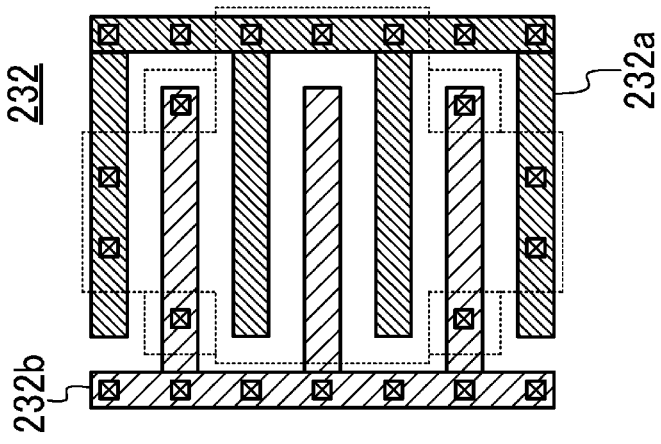
Figure 25A:
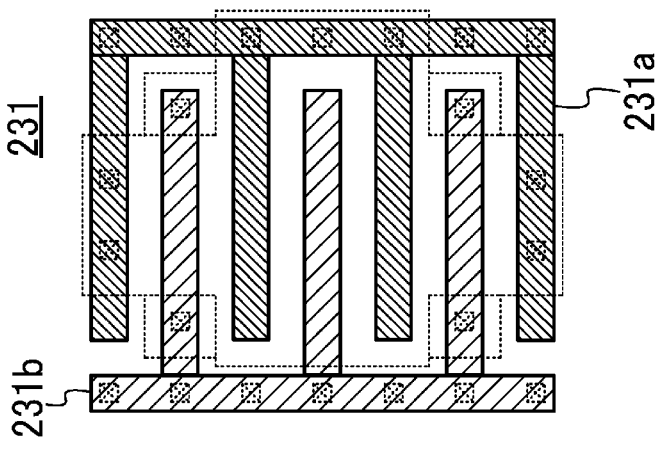

Next, with reference to FIGS. 25A-25C, third example configurations of the interconnect capacitor and the MOS capacitor will be described. FIGS. 25A and 25B illustrate example plan configurations respectively of Xth and (X+1)th interconnect layers 231 and 232 included in the interconnect capacitor 200. FIG. 25C illustrates an example plan configuration of a MOS capacitor 23. The interconnect layer 231 includes capacitance interconnects 231a and 231b. The interconnect layer 232 includes capacitance interconnects 232a and 232b. The MOS capacitor 23 includes a cross-shaped gate electrode 23a and a diffusion region 23b.

The capacitance interconnects 231a and 231b have configurations similar to the configurations of the capacitance interconnects 211a and 211b of FIG. 22A. The capacitance interconnects 232a and 232b have configurations similar to the configurations of the capacitance interconnects 212a and 212b of FIG. 22B. A channel region is formed under the gate electrode 23a (in a lower portion of the semiconductor integrated circuit device in the stacking direction).

The capacitance interconnects 231a and 232a and the gate electrode 23a overlap each other when viewed in plan and are electrically connected to each other through vias and contacts. Similar to the capacitance interconnects 231a and 232a and the gate electrode 23a, the capacitance interconnects 231b and 232b and the diffusion region 23b overlap each other when viewed in plan and are electrically connected to each other through vias and contacts. A combination of the capacitance interconnects 231a and 232a and the gate electrode 23a is electrically connected to the resistive element 11. A combination of the capacitance interconnects 231b and 232b and the diffusion region 23b is electrically connected to the ground supply interconnect WSS. Note that the combination of the capacitance interconnects 231a and 232a and the gate electrode 23a may be electrically connected to the ground supply interconnect WSS, and the combination of the capacitance interconnects 231b and 232b and the diffusion region 23b may be electrically connected to the resistive element 11.

With the above configuration, since the area of the channel region can be increased compared to the MOS capacitor 21 of FIG. 22C, the capacitance value of the MOS capacitor per unit area can be increased compared to the capacitance value in the first example configuration of the interconnect capacitor and the MOS capacitor of FIGS. 22A-22C. Note that any of the first to seventh example configurations (see FIGS.

7-20) of the interconnect capacitor may be provided instead of the interconnect layers 231 and 232. A transistor, such as a next generation fin transistor, having a three-dimensional structure allowing an increase in the area of the channel region may be provided instead of the MOS capacitor 23.

Third Embodiment

Figure 26A:
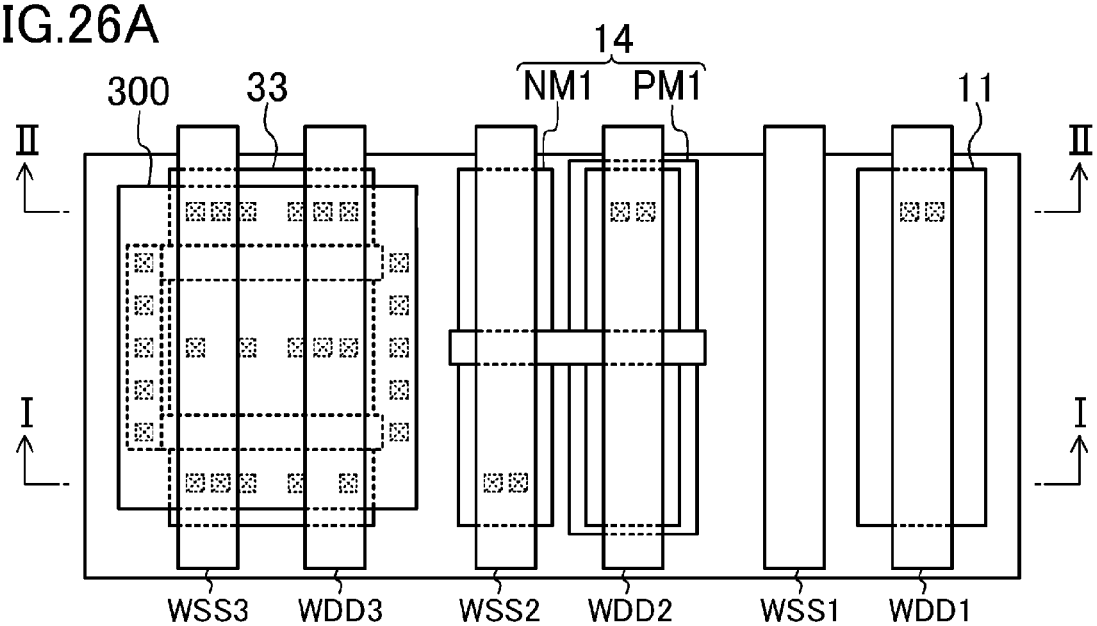
FIG. 26A is a plan view illustrating an example plan configuration of a power supply cell according to a third embodiment.
Figure 26B:
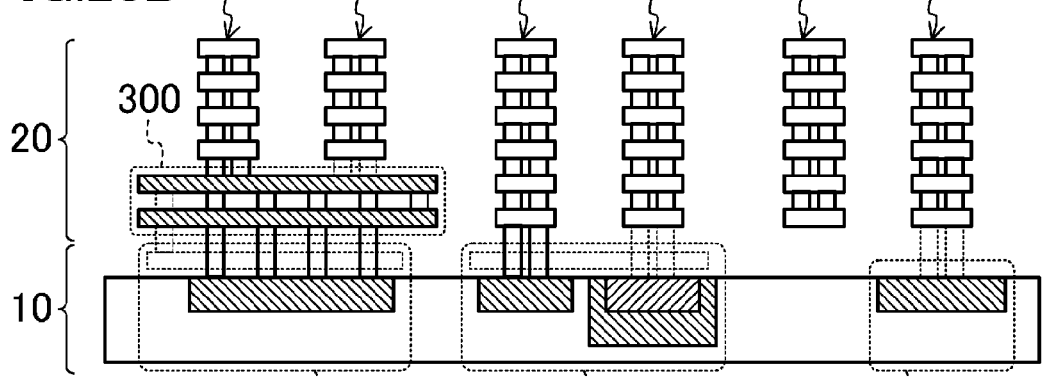
FIG. 26B is a cross-sectional view illustrating an example cross-sectional configuration along the line I-I of the power supply cell of FIG. 26A.
Figure 26C:
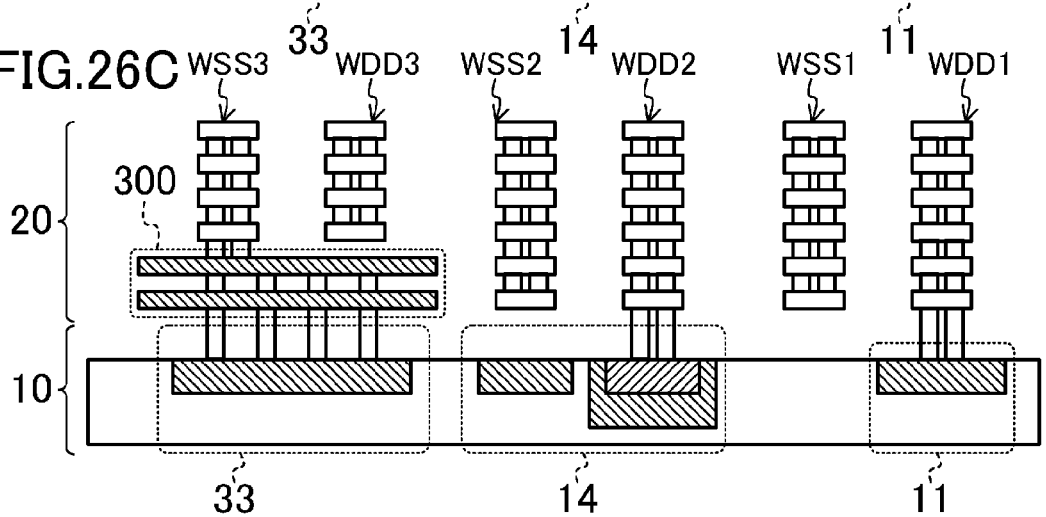
FIG. 26C is a cross-sectional view illustrating an example cross-sectional configuration along the line II-II of the power supply cell of FIG. 26A.

A semiconductor integrated circuit device according to a third embodiment includes power supply cells as illustrated in FIGS. 26A-26C instead of power supply cells as illustrated in FIGS. 5A-5C. The other configurations are the same as those of the semiconductor integrated circuit device according to the first embodiment.

[Power Supply Cell]

FIG. 26A illustrates an example plan configuration of the power supply cell according to the third embodiment. FIGS. 26B and FIG. 26C illustrate example cross-sectional configurations respectively along the lines I-I and II-II of the power supply cell of FIG. 26A. Note that in FIGS. 26A-26C, for the convenience of the description, illustration of a power interconnect WD (or a ground interconnect WS) is omitted. In the power supply cell, a resistive element 11, a protecting element 33, and a controller 14, which are components included in an ESD protection circuit (see FIG. 2), are formed in an element formation layer 10. At least part of a capacitive element 12 (the entirety of the capacitive element 12 in the present embodiment), which is a component included in the ESD protection circuit, is an interconnect capacitor 300. The interconnect capacitor 300 is provided in a plurality of interconnect layers 20. Moreover, at least part of a region in which the interconnect capacitor 300 is formed (capacitance formation region) overlaps, when viewed in plan, at least part of a region in which the resistive element 11, the protecting element 33, and the controller 14 are formed (element formation region). In the present embodiment, the capacitance formation region overlaps, when viewed in plan, part of a region in which the protecting element 33 is formed.

As described above, the interconnect capacitor 300 is formed above the protecting element 33 (in an upper portion of the semiconductor integrated circuit device in the stacking direction). In general, in portions of the plurality of interconnect layers 20 which overlap, when viewed in plan, a region in which the protecting element 33 is formed, part of the interconnect layers 20 is used to electrically connect the protecting element 33 to a component (e.g., the power interconnect WD), but the other parts of the plurality of interconnect layers 20 remain unused. Therefore, the portions of the plurality of interconnect layers 20 which overlap, when viewed in plan, the region in which the protecting element 33 is formed, can be effectively used as the interconnect capacitor 300. With this configuration, since one or more interconnect layers arranged above the protecting element 33 can be effectively used as the interconnect capacitor 300, it is possible to reduce an increase in area caused by an increase in the capacitance value of the capacitive element 12 included in the ESD protection circuit compared to the case where the capacitive element 12 is formed in the element formation layer 10.

[Example Configurations of Interconnect Capacitor and Protecting Element]

Here, with reference to FIGS. 27A-27C and FIGS. 28A-28C, example configurations of the interconnect capacitor and the protecting element will be described. FIGS. 27A and 27B illustrate example plan configurations respectively of Xth and (X+1)th interconnect layers 311 and 312 included in the interconnect capacitor 300. FIG. 27C illustrates an example plan configuration of the protecting element 33.

Figures 28A, 28B, 28C:
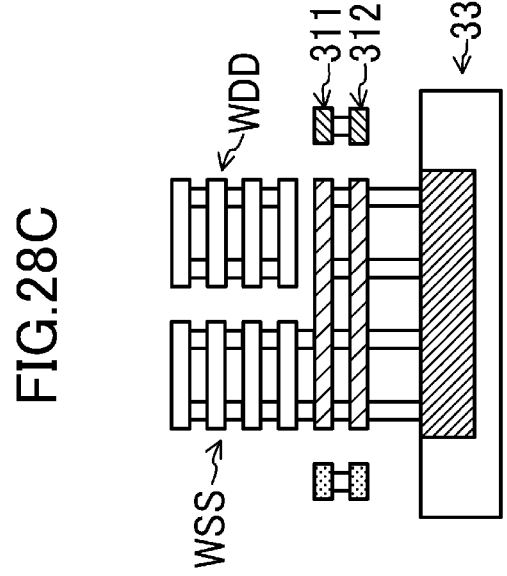
FIGS. 28A-28C are cross-sectional views illustrating the interconnect capacitor and an example configuration of the protecting element.

FIGS. 28A, 28B, and 28C illustrate example cross-sectional configurations respectively along the lines I-I, II-II, and III-III of the interconnect capacitor 300 and the protecting element 33 of FIG. 27A. The interconnect layer 311 includes capacitance interconnects 311a, 311b, 311c, and 311d. The interconnect layer 312 includes capacitance interconnects 312a, 312b, 312c, and 312d. The protecting element 33 includes diffusion regions 33a and 33b, and a gate electrode 33c.

The two capacitance interconnects 311a and 311a are separated from each other when viewed in plan and extend in a second direction D2. The capacitance interconnect 311b extends in the second direction D2 when viewed in plan. The capacitance interconnect 311c extends in a first direction D1 when viewed in plan. The capacitance interconnect 311d extends in the first direction D1 when viewed in plan and has four interconnect portions extending in the second direction D2. Each of the two capacitance interconnects 311a and the capacitance interconnect 311b is arranged between adjacent ones of four interconnect portions of the capacitance interconnect 311d when viewed in plan. The capacitance interconnects 312a, 312b, 312c, and 312d have configurations similar to the configurations of the capacitance interconnects 311a, 311b, 311c, and 311d, respectively. The gate electrode 33c includes an electrode body extending in the first direction D1 when viewed in plan, and two electrode portions extending from the gate electrode body in the second direction D2. A channel region is formed under the two electrode portions of the gate electrode 33c (in a lower portion of the semiconductor integrated circuit device in the stacking direction). The two diffusion regions 33a correspond to a source region, and the diffusion region 33b corresponds to a drain region. That is, the protecting element 33 includes two NMOS transistors which share the drain region and the gate electrode.

The capacitance interconnects 311a and 312a and the diffusion region 33a (source region) overlap each other when viewed in plan and are electrically connected to each other through vias and contacts. The capacitance interconnects 311b and 312b and the diffusion region 33b (drain region) overlap each other when viewed in plan and are electrically connected to each other through vias and contacts. The capacitance interconnects 311c and 312c and the gate electrode 33c overlap each other when viewed in plan and are electrically connected to each other through vias and contacts. The capacitance interconnects 311d and 312d overlap each other when viewed in plan and are electrically connected to each other through vias. A combination of the capacitance interconnect 311a and 312a and the diffusion region 33a (source region) is electrically connected to a ground supply interconnect WSS through vias and contacts. A combination of the capacitance interconnects 311b and 312b and the diffusion region 33b (drain region) is electrically connected to a power supply interconnect WDD through vias and contacts. A combination of the capacitance interconnects 311c and 312c and the gate electrode 33c is electrically connected to the controller 14 (e.g., an output terminal of an inverter circuit) through vias and contacts. A combination of the capacitance interconnects 311d and 312d is electrically connected to the resistive element 11 through vias and contacts. Note that components to which these combinations are connected are not limited to those described above.

With this configuration, the area of the capacitance interconnects can be reduced compared to the case where a parallel flat plate-type capacitor is formed by providing a flat plate capacitance interconnect to each of adjacent interconnect layers. Note that any of the first to seventh example configurations of the interconnect capacitor (see FIGS. 7-20) may be provided instead of the capacitance interconnects 311a, 311d, 312a, and 312d.

In order to enhance resistance to ESD, the resistance value of the diffusion region 33b (drain region) may be higher than the resistance value of the diffusion region 33a (source region). That is, the resistance value of a current path formed between one of the power supply interconnect WDD or the ground supply interconnect WSS and the protecting element 33 may be higher than the resistance value of a current path formed between the other of the power supply interconnect WDD or the ground supply interconnect WSS and the protecting element 33. For example, of the diffusion regions 33a and the diffusion region 33b, only the diffusion regions 33a (the source regions) may be silicided, or the distance from the gate electrode 33c to the drain electrode (specifically, the distance from each of the electrode portions of the gate electrode 33c extending in the second direction D2 to contacts formed in the diffusion region 33b) may be larger than the distance from the gate electrode 33c to the source region (specifically, the distance from each of the electrode portions of the gate electrode 33c extending in the second direction D2 to contacts formed in the diffusion region 33a). With this configuration, a region in which the protecting element 33 is formed is increased, so that it is possible to increase interconnect layers which can be effectively used as the interconnect capacitor 300.

Other Embodiments

In the above embodiments, the case where a region in which the interconnect capacitor is formed overlaps, when viewed in plan, a region in which the resistive element is formed, a region in which the MOS capacitor is formed, or a region in which the protecting element is formed has been described. However, also in the case where the region in which the interconnect capacitor is formed overlaps, when viewed in plan, a region in which the controller is formed, it is possible to reduce an increase in area caused by an increase in the capacitance value of the capacitive element included in the ESD protection circuit. That is, when at least part of the region in which the interconnect capacitor is formed (capacitance formation region) overlaps at least part of a region in which the resistive element, the protecting element, and the controller are formed (element formation region), it is possible to reduce an increase in area caused by an increase in the capacitance value of the capacitive element included in the ESD protection circuit. Alternatively, in the case where the MOS capacitor is formed, and at least part of the region in which the interconnect capacitor is formed (capacitance formation region) overlaps, when viewed in plan, at least part of a region in which the resistive element, the protecting element, the controller, and the MOS capacitor are formed (element formation region), it is possible to reduce an increase in area caused by an increase in the capacitance value of the capacitive element included in the ESD protection circuit.

The interconnect capacitor may include one of the interconnect layers 20 which is adjacent to the element formation layer 10 in the stacking direction of the semiconductor integrated circuit device. With this configuration, the interconnect layers can efficiently be used. In this way, it is possible to increase the number of interconnect layers (sequential interconnect layers) used as the power supply interconnect WDD (or the ground supply interconnect WSS), and thus it is possible to increase the transmission efficiency of the power supply voltage VDD (or the ground voltage VSS). Since the number of interconnect layers used as the interconnect capacitor can be increased, it is possible to increase the capacitance value of the interconnect capacitor per unit area. The interconnect capacitor may include one of the interconnect layers 20 which is arranged above the interconnect layer adjacent to the element formation layer 10 in the stacking direction of the semiconductor integrated circuit device.

Figure 29:
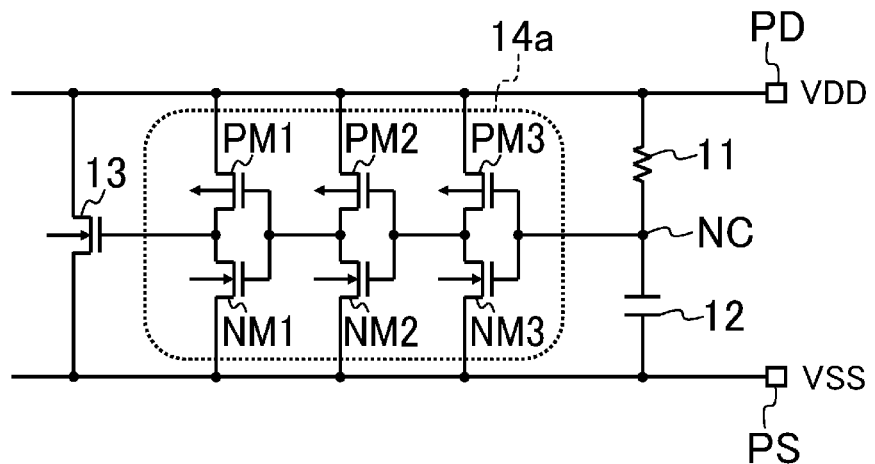
FIG. 29 is a circuit diagram illustrating a first variation of the ESD protection circuit.
Figure 30:
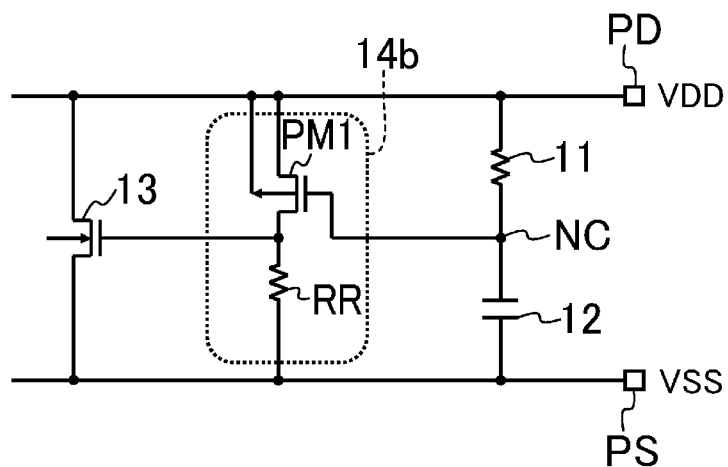
FIG. 30 is a circuit diagram illustrating a second variation of the ESD protection circuit.

The ESD protection circuit may include a controller 14a illustrated in FIG. 29 or a controller 14b illustrated in FIG. 30 instead of the controller 14 of FIG. 2. The controller 14a illustrated in FIG. 29 includes a plurality of cascade-connected inverter circuits (three-stage inverter circuit including PMOS transistors PM1, PM2, and PM3 and NMOS transistors NM1, NM2, and NM3 in the present embodiment). The controller 14b illustrated in FIG. 30 includes a resistive element RR instead of the NMOS transistor NM1 of FIG. 2. Also with this configuration, a semiconductor integrated circuit (e.g., the internal circuit IC) can be protected against breakdown due to electrostatic discharge (ESD).

The ESD protection circuit may be disposed in a logical block or an analogue block included in the internal circuit IC in addition to the power supply cell.

Figure 31:
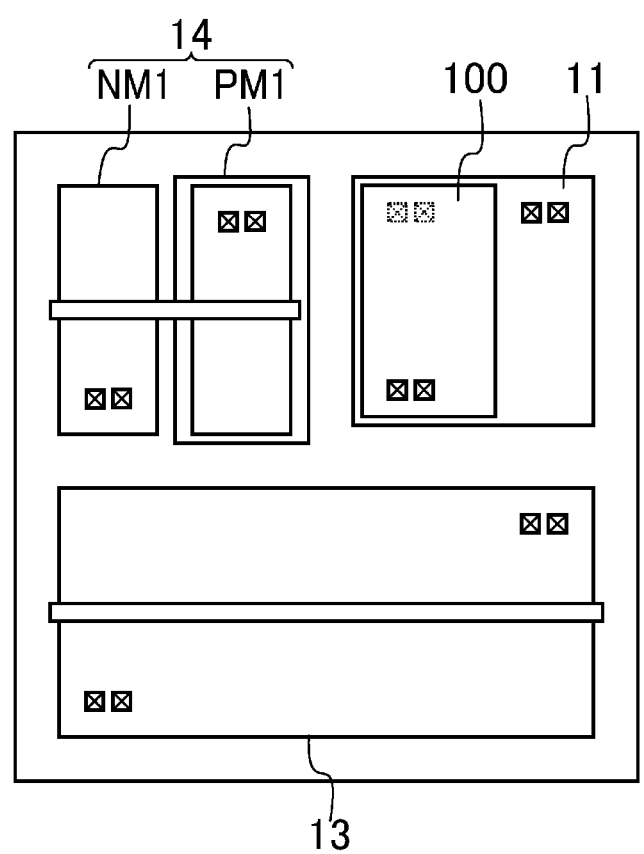
FIG. 31 is a plan view illustrating a variation of the power supply cell.

As illustrated in FIG. 31, components of the ESD protection circuit (here, the resistive element 11, the protecting element 13, the controller 14, and the interconnect capacitor 100) may be arranged so as to be within a region of the power supply cell (I/O cell) in which the aspect ratio (the ratio of the cell height to the cell width) is changed. For example, when the aspect ratio of the I/O cell is optimized in accordance with the limitation of the pad pitch (minimum distance between electrode pads), and when the ESD protection circuit is formed in a space area in the logical block or the analogue block, the arrangement of the components of the ESD protection circuit may be optimized so as to be within a region of the I/O cell (or the space area).

As described above, the above-described semiconductor integrated circuit device can reduce an increase in area caused by an increase in the capacitance value of the capacitive element included in the ESD protection circuit, and thus is suitable as a semiconductor integrated circuit device which requires cost reduction.

What is claimed is:

1. A semiconductor integrated circuit device comprising:
an ESD protection circuit;
an element formation layer; and
a plurality of interconnect layers above the element formation layer, wherein
the ESD protection circuit includes
a resistive element and a capacitive element connected in series between a first terminal and a second terminal of the ESD protection circuit,
a protecting element connected between the first terminal and the second terminal, and
a controller configured to control a conductive state of the protecting element in accordance with a potential at a connect node between the resistive element and the capacitive element,
the resistive element, the protecting element, and the controller are provided in the element formation layer,
at least part of the capacitive element includes an interconnect capacitor provided in the interconnect layers, and
when viewed in plan, at least part of a capacitance formation region in which the interconnect capacitor is provided overlaps at least part of an element formation region in which the resistive element, the protecting element, and the controller are provided.

2. The semiconductor integrated circuit device of claim 1, wherein the interconnect layers include a plurality of interconnects separated from each other to form the interconnect capacitor.

3. The semiconductor integrated circuit device of claim 1, wherein
the interconnect layers include a first interconnect layer,
the first interconnect layer includes a first capacitance interconnect and a second capacitance interconnect which are separated from each other and extend in a first direction when viewed in plan,
the first capacitance interconnect includes a plurality of first interconnect portions extending in a second direction orthogonal to the first direction,
the second capacitance interconnect includes a plurality of second interconnect portions extending in the second direction, and
each of the second interconnect portions of the second capacitance interconnect is arranged between adjacent ones of the first interconnect portions of the first capacitance interconnect when viewed in plan.

4. The semiconductor integrated circuit device of claim 3, wherein
the interconnect layers include a second interconnect layer adjacent to the first interconnect layer in a stacking direction of the interconnect layers,
the second interconnect layer includes a third capacitance interconnect and a fourth capacitance interconnect which are separated from each other and extend in the first direction when viewed in plan,
the third capacitance interconnect includes a plurality of third interconnect portions extending in the second direction,
the fourth capacitance interconnect includes a plurality of fourth interconnect portions extending in the second direction,
each of the fourth interconnect portions of the fourth capacitance interconnect is arranged between adjacent ones of the third interconnect portions of the third capacitance interconnect when viewed in plan,
the third capacitance interconnect and the first capacitance interconnect overlap each other when viewed in plan, and
the fourth capacitance interconnect and the second capacitance interconnect overlap each other when viewed in plan.

5. The semiconductor integrated circuit device of claim 1, wherein
the element formation layer includes a plurality of I/O cells arranged in a cell arrangement direction,
the ESD protection circuit is arranged in a power supply cell of the I/O cells, a power supply voltage or a ground voltage being applied to the power supply cell,
at least one of the interconnect layers includes a supplying interconnect extending in the cell arrangement direction above the I/O cells to supply the I/O cells with the power supply voltage or the ground voltage applied to the power supply cell,
interconnect layers included in an overlapping interconnect portion are fewer than interconnect layers included in an non-overlapping interconnect portion, the overlapping interconnect portion being a portion of the supplying interconnect which overlaps part of the power supply cell when viewed in plan, the non-overlapping interconnect portion being a portion of the supplying interconnect except the overlapping interconnect portion, and
the interconnect capacitor is provided in a region of the interconnect layers which overlaps part of the power supply cell when viewed in plan.

6. The semiconductor integrated circuit device of claim 1, wherein
the interconnect capacitor is provided in one or more of the interconnect layers which are adjacent to the element formation layer in a stacking direction of the interconnect layers.

7. The semiconductor integrated circuit device of claim 1, wherein
the resistive element includes at least one of a polysilicon resistor, a diffusion resistor, or a well resistor.

8. The semiconductor integrated circuit device of claim 1, wherein
the protecting element includes at least one of a MOS transistor or a bipolar transistor.

9. The semiconductor integrated circuit device of claim 1, wherein
the controller includes an inverter circuit connected between the connect node and the protecting element.

10. The semiconductor integrated circuit device of claim 1, wherein
a resistance value of a current path between one of the first terminal or the second terminal and the protecting element is larger than a resistance value of a current path between the other of the first terminal or the second terminal and the protecting element.

11. A semiconductor integrated circuit device comprising:
an ESD protection circuit;
an element formation layer; and
a plurality of interconnect layers above the element formation layer, wherein
the ESD protection circuit includes
a resistive element and a capacitive element connected in series between a first terminal and a second terminal of the ESD protection circuit,
a protecting element connected between the first terminal and the second terminal, and
a controller configured to control a conductive state of the protecting element in accordance with a potential at a connect node between the resistive element and the capacitive element,
the resistive element, the protecting element, and the controller are provided in the element formation layer,
the capacitive element includes an interconnect capacitor provided in the interconnect layers and a MOS capacitor provided in the element formation layer, and
when viewed in plan, at least part of a capacitance formation region in which the interconnect capacitor is provided overlaps at least part of an element formation region in which the resistive element, the protecting element, the controller, and the MOS capacitor are provided.

12. The semiconductor integrated circuit device of claim 11, wherein
the MOS capacitor has a gate electrode which is in a cross shape when viewed in plan.

* * * * *